US012589403B2

(12) United States Patent
Nemoto et al.

(10) Patent No.: US 12,589,403 B2
(45) Date of Patent: Mar. 31, 2026

(54) SUBSTRATE PROCESSING APPARATUS AND SUBSTRATE PROCESSING METHOD

(71) Applicant: SCREEN Holdings Co., Ltd., Kyoto (JP)

(72) Inventors: Shuhei Nemoto, Kyoto (JP); Kazuhiro Shoji, Kyoto (JP); Ryotaro Shinohara, Kyoto (JP); Akira Ito, Kyoto (JP); Itsuki Kajino, Kyoto (JP)

(73) Assignee: SCREEN HOLDINGS CO., LTD. (JP)

( * ) Notice: Subject to any disclaimer, the term of this patent is extended or adjusted under 35 U.S.C. 154(b) by 312 days.

(21) Appl. No.: 18/180,957

(22) Filed: Mar. 9, 2023

(65) Prior Publication Data

US 2023/0302478 A1     Sep. 28, 2023

(30) Foreign Application Priority Data

Mar. 23, 2022     (JP) ................................. 2022-046651

(51) Int. Cl.
*H01L 21/67* (2006.01)
*B05B 1/00* (2006.01)
(Continued)

(52) U.S. Cl.
CPC .......... *B05B 13/0228* (2013.01); *B05B 1/005* (2013.01); *B05B 12/02* (2013.01);
(Continued)

(58) Field of Classification Search
CPC ..... B05B 13/0228; B05B 1/005; B05B 12/02; B05B 14/10; B05B 12/1409; B05B 1/24;
B05B 12/18; B05B 12/20; B05B 13/0285; B05B 13/041; B05B 14/00; B05B 16/60; B05C 1/006; B05C 11/1042; H01L 21/67051; H01L 21/67103;
(Continued)

(56) References Cited

U.S. PATENT DOCUMENTS

2004/0077159 A1     4/2004  Yun et al. ..................... 438/584
2009/0056764 A1*    3/2009  Minami ............ H01L 21/67034
134/28

(Continued)

FOREIGN PATENT DOCUMENTS

JP     2011-054932 A     3/2011
JP     2012-084856 A     4/2012
(Continued)

OTHER PUBLICATIONS

Machine translation of WO-2017169019-A1 (Year: 2017).*
(Continued)

*Primary Examiner* — Erin F Bergner
(74) *Attorney, Agent, or Firm* — OSTROLENK FABER LLP

(57) ABSTRACT

The invention includes a gas supplier for discharging a gas into a space sandwiched between a substrate and a shielding plate by supplying the gas to a gas discharge nozzle provided in the shielding plate to form a flow of the gas from a central part toward a radially outer side of the substrate. This gas supplier is controlled such that a flow velocity of the gas into a discharge space at a peripheral edge part of the substrate becomes larger than zero.

6 Claims, 24 Drawing Sheets

(51) Int. Cl.

| | |
|---|---|
| *B05B 12/02* | (2006.01) |
| *B05B 13/02* | (2006.01) |
| *B05B 14/10* | (2018.01) |
| *B05C 1/00* | (2006.01) |
| *B05C 11/10* | (2006.01) |

(52) U.S. Cl.
CPC .............. *B05B 14/10* (2018.02); *B05C 1/006* (2013.01); *B05C 11/1042* (2013.01); *H01L 21/67051* (2013.01); *H01L 21/6715* (2013.01)

(58) Field of Classification Search
CPC ......... H01L 21/67098; H01L 21/67017; H01L 21/6715; H01L 21/68785; H01L 21/68792
See application file for complete search history.

(56) References Cited

U.S. PATENT DOCUMENTS

| | | | |
|---|---|---|---|
| 2011/0030737 A1 | 2/2011 | Amano et al. .................. | 134/32 |
| 2012/0064256 A1 | 3/2012 | Higashijima et al. ........ | 427/532 |
| 2013/0171831 A1 | 7/2013 | Namba et al. ................ | 438/748 |
| 2015/0258582 A1* | 9/2015 | Hashizume ....... | H01L 21/31138 |
| | | | 156/345.23 |

FOREIGN PATENT DOCUMENTS

| | | | | | |
|---|---|---|---|---|---|
| JP | 5437168 | B2 | 3/2014 | | |
| JP | 6282904 | B2 | 2/2018 | | |
| KR | 10-2004-0034856 | A | 4/2004 | | |
| KR | 10-2017-0120057 | A | 10/2017 | | |
| TW | 202023696 | A | 7/2020 | | |
| TW | 202129750 | A | 8/2021 | | |
| WO | WO-2017169019 | A1 * | 10/2017 | ....... | H01L 21/68764 |
| WO | WO 2018/037982 | A1 | 3/2018 | | |

OTHER PUBLICATIONS

Taiwanese Office Action dated Sep. 19, 2023, issued in corresponding Taiwanese Patent Application No. 112103816.

Office Action mailed Jun. 11, 2024 issued in corresponding Korean Patent Application No. 10-2023-0036406, and its English translation attached.

Office Action dated Sep. 16, 2025, issued in corresponding Japanese Patent Application No. JP2022-046651. English translation attached.

Office Action issued on Feb. 2, 2026 for the corresponding Korean Patent Application No. 10-2025-0049366.

* cited by examiner (a) BEVEL PROCESSING POSITION         (b) PRE-DISPENSE POSITION

START

S1
LOADING OF SUBSTRATE

S2
CENTERING OF
SUBSTRATE

S3
MOVE DOWN LOWER
SEALING CUP MEMBER

S4
START ROTATION OF SPIN
CHUCK AND CUP

S5
START SUPPLY OF GAS
FLOW

S6
PROCESS BEVEL WITH
PROCESSING LIQUID

S7
STOP SUPPLY OF GAS
FLOW

S8
STOP ROTATION OF SPIN
CHUCK AND CUP

S9
INSPECT BEVEL
PROCESSING

S10
UNLOADING OF
SUBSTRATE

END

DISTANCE FROM CENTER OF SUBSTRATE[mm]

DISCHARGE TEMPERATURE OF HEATING GAS
[°C] at 0mm、150mm

SUBSTRATE PROCESSING APPARATUS AND SUBSTRATE PROCESSING METHOD

CROSS REFERENCE TO RELATED APPLICATION

The disclosure of Japanese Patent Application No. 2022-46651 filed on Mar. 23, 2022 including specification, drawings and claims is incorporated herein by reference in its entirety.

BACKGROUND OF THE INVENTION

1. Field of the Invention

This invention relates to a substrate processing technique for processing a substrate by supplying a processing liquid to a peripheral edge part of the substrate.

2. Description of the Related Art

A substrate processing apparatus is known which applies a chemical processing or cleaning processing by supplying a processing liquid to a substrate such as a semiconductor wafer while rotating the substrate. For example, in an apparatus described in JP 5437168B, a processing liquid is supplied to a peripheral edge part of a substrate held by a spin chuck and rotating in a processing chamber. In this apparatus, a shielding unit with a built-in heater is used to satisfactorily process the peripheral edge part of the substrate.

SUMMARY OF INVENTION

In this conventional technique, a technical concept is described according to which the upper surface of the substrate is heated while being covered and protected by a facing plate (equivalent to a "shielding plate" of the invention) facing the upper surface of the substrate. However, to satisfactorily process the peripheral edge part of the substrate with the processing liquid, there are a plurality of matters to be individually and specifically considered. Those matters are neither specifically disclosed nor indicated in JP 5437168B.

This invention was developed in view of the above problem and aims to satisfactorily process a peripheral edge part of a substrate in a substrate processing technique for processing the peripheral edge part of the substrate by supplying a processing liquid to the peripheral edge part while covering and protecting the upper surface of the substrate by a shielding plate and heating the upper surface of the substrate.

A first aspect of the invention is a substrate processing apparatus. The substrate processing apparatus comprises: a substrate holder configured to hold a substrate from below and provided rotatably about an axis of rotation extending in a vertical direction; a rotating mechanism configured to rotate the substrate holder; a processing mechanism configured to process the substrate by supplying a processing liquid to a peripheral edge part of the substrate held by the substrate holder; an upper surface protecting/heating mechanism configured to heat an upper surface of the substrate while covering and protecting the upper surface of the substrate by a shielding plate arranged at a predetermined interval from the upper surface of the substrate held by the substrate holder; a scattering preventing mechanism configured to collect the processing liquid scattered from the substrate according to rotation of the substrate holder while surrounding an outer periphery of the rotating substrate and thereafter discharge the processing liquid by way of a discharge space; and a control unit configured to control the upper surface protecting/heating mechanism, wherein the upper surface protecting/heating mechanism includes a gas supplier configured to supply the gas to a gas discharge nozzle provided in the shielding plate so as to form a flow of the gas from a central part toward a radially outer side of the substrate and discharge the gas into a space sandwiched between the substrate and the shielding plate, and the control unit controls the gas supplier such that a flow velocity of the gas into the discharge space at the peripheral edge part of the substrate becomes larger than zero.

A second aspect of the invention is a substrate processing apparatus. The substrate processing apparatus comprises: a substrate holder configured to hold a substrate from below and provided rotatably about an axis of rotation extending in a vertical direction; a rotating mechanism configured to rotate the substrate holder; a processing mechanism configured to process the substrate by supplying a processing liquid to a peripheral edge part of the substrate held by the substrate holder in a processing space at a normal temperature; an upper surface protecting/heating mechanism configured to heat an upper surface of the substrate while covering and protecting the upper surface of the substrate by a shielding plate arranged at a predetermined interval from the upper surface of the substrate held by the substrate holder; and a control unit configured to control the upper surface protecting/heating mechanism, wherein the upper surface protecting/heating mechanism includes a gas supplier configured to discharging a gas into a space sandwiched between the substrate and the shielding plate by supplying the gas to a gas discharge nozzle provided in the shielding plate to form a flow of the gas from a central part toward a radially outer side of the substrate, and the control unit controls the upper surface protecting/heating mechanism such that a temperature of the gas discharged from the gas discharge nozzle is in a discharge temperature range of 65° C. to 130° C.

A third aspect of the invention is a substrate processing apparatus. The substrate processing apparatus comprises: a substrate holder configured to hold a substrate from below and provided rotatably about an axis of rotation extending in a vertical direction; a rotating mechanism configured to rotate the substrate holder; a processing mechanism, including a processing liquid discharge nozzle configured to discharge a processing liquid from a discharge port, configured to process the substrate by causing the processing liquid discharged from the discharge port to land on a peripheral edge part of the substrate held by the substrate holder; an upper surface protecting/heating mechanism configured to heat an upper surface of the substrate while covering and protecting the upper surface of the substrate by a shielding plate arranged at a predetermined interval from the upper surface of the substrate held by the substrate holder; and a control unit configured to control the upper surface protecting/heating mechanism, wherein a cut open radially outwardly of the shielding plate being provided in a peripheral edge part of the shielding plate, the processing mechanism includes a nozzle mover configured to move the processing liquid discharge nozzle in the cut, and the control unit controlling the nozzle mover such that the discharge port faces a liquid landing position after a change in changing the liquid landing position of the processing liquid discharged from the discharge port.

A fourth aspect of the invention is a substrate processing method. The substrate processing method comprises: (a) processing a substrate by supplying a processing liquid to a peripheral edge part of the substrate while rotating the substrate about an axis of rotation extending in a vertical direction; (b) covering and protecting an upper surface of the substrate by a shielding plate arranged at a predetermined interval from the upper surface of the substrate and heating the upper surface of the substrate; (c) collecting the processing liquid scattered from the substrate according to rotation of the substrate while surrounding an outer periphery of the rotating substrate and discharging the collected processing liquid by way of a discharge space, wherein the operation (b) includes: (b-1) discharging a gas into a space sandwiched between the substrate and the shielding plate from a gas discharge nozzle provided in the shielding plate to form a flow of the gas from a central part toward a radially outer side of the substrate; and (b-2) controlling a discharge flow rate of the gas discharged from the gas discharge nozzle such that a flow velocity of the gas into the discharge space at the peripheral edge part of the substrate becomes larger than zero.

A fifth aspect of the invention is a substrate processing method. The substrate processing method comprises: (a) processing a substrate by supplying a processing liquid to a peripheral edge part of the substrate while rotating the substrate about an axis of rotation extending in a vertical direction; and (b) covering and protecting an upper surface of the substrate by a shielding plate arranged at a predetermined interval from the upper surface of the substrate and heating the upper surface of the substrate; wherein the operations (a) and (b) are performed in parallel in a processing space at a normal temperature, the operation (b) includes: (b-1) discharging a gas into a space sandwiched between the substrate and the shielding plate from a gas discharge nozzle provided in the shielding plate to form a flow of the gas from a central part toward a radially outer side of the substrate; and (b-3) adjusting a temperature of the gas such that the temperature of the gas discharged from the gas discharge nozzle is in a discharge temperature range of 65° C. to 130° C.

A sixth aspect of the invention is a substrate processing method. The substrate processing method comprises: (a) processing a substrate by supplying a processing liquid discharged from a discharge port of a processing liquid discharge nozzle to a peripheral edge part of the substrate while rotating the substrate about an axis of rotation extending in a vertical direction; and (b) covering and protecting an upper surface of the substrate by a shielding plate arranged at a predetermined interval from the upper surface of the substrate and heating the upper surface of the substrate; wherein the operations (a) and (b) are performed in parallel, the operation (a) includes moving the processing liquid discharge nozzle in a cut open radially outwardly of the shielding plate such that the discharge port faces a liquid landing position after a change in changing the liquid landing position of the processing liquid discharged from the discharge port.

According to the invention, a peripheral edge part of a substrate can be satisfactorily processed in a substrate processing technique for processing the peripheral edge part of the substrate by supplying a processing liquid to the peripheral edge part while covering and protecting the upper surface of the substrate by a shielding plate and heating the upper surface of the substrate.

All of a plurality of constituent elements of each aspect of the invention described above are not essential and some of the plurality of constituent elements can be appropriately changed, deleted, replaced by other new constituent elements or have limited contents partially deleted in order to solve some or all of the aforementioned problems or to achieve some or all of effects described in this specification. Further, some or all of technical features included in one aspect of the invention described above can be combined with some or all of technical features included in another aspect of the invention described above to obtain one independent form of the invention in order to solve some or all of the aforementioned problems or to achieve some or all of the effects described in this specification.

DETAILED DESCRIPTION OF THE PREFERRED EMBODIMENTS

Figure 1:
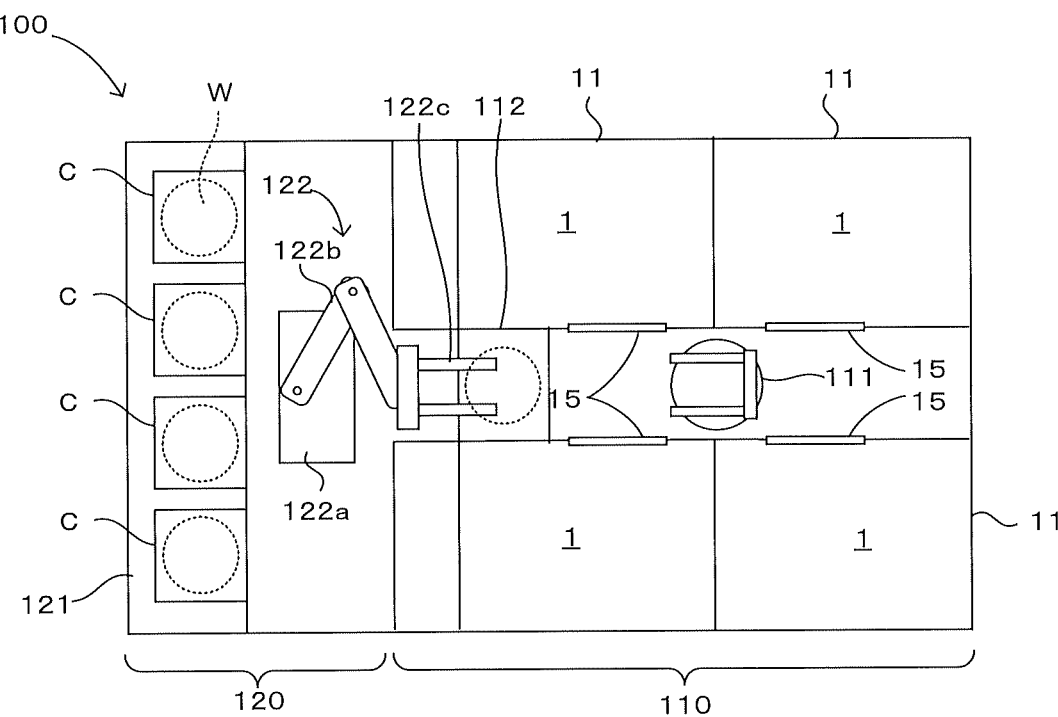
FIG. 1 is a plan view showing a schematic configuration of a first embodiment of a substrate processing apparatus according to the invention.

FIG. 1 is a plan view showing a schematic configuration of a first embodiment of a substrate processing apparatus according to the invention. This figure is a diagram not showing the external appearance of the apparatus, but showing an internal structure of a substrate processing system 100 by excluding an outer wall panel and other partial configurations. This substrate processing system 100 is, for example, a single-wafer type apparatus installed in a clean room and configured to process substrates W each having a circuit pattern (hereinafter, referred to as a "pattern") only on one principal surface one by one. An embodiment of a substrate processing method according to the invention is carried out in a processing unit 1 equipped in the substrate processing system 100. In this specification, a pattern formation surface (one principal surface) formed with the pattern is referred to as a "front surface" and the other principal surface not formed with the pattern on an opposite side is referred to as a "back surface". Further, a surface facing down is referred to as a "lower surface" and a surface facing up is referred to as an "upper surface". Further, in this specification, the "pattern formation surface" means a surface of the substrate where an uneven pattern is formed in an arbitrary region regardless of whether the surface is flat, curved or uneven.

Here, various substrates such as semiconductor wafers, glass substrates for photomask, glass substrates for liquid crystal display, glass substrates for plasma display, substrates for FPD (Flat Panel Display), optical disk substrates, magnetic disk substrates and magneto-optical disk substrates can be applied as the "substrate" in this embodiment. Although the substrate processing apparatus used in processing semiconductor wafers is mainly described as an example with reference to the drawings below, application to the processing of various substrates illustrated above is also possible.

As shown in FIG. 1, the substrate processing system 100 includes a substrate processing station 110 for processing the substrate W and an indexer station 120 coupled to this substrate processing station 110. The indexer station 120 includes a container holder 121 capable of holding a plurality of containers C for housing the substrates W (FOUPs (Front Opening Unified Pods), SMIF (Standard Mechanical Interface) pods, OCs (Open Cassettes) for housing a plurality of the substrates W in a sealed state), and an indexer robot 122 for taking out an unprocessed substrate W from the container C by accessing the container C held by the container holder 121 and housing a processed substrate W in the container C. A plurality of the substrates W are housed substantially in a horizontal posture in each container C.

The indexer robot 122 includes a base 122a fixed to an apparatus housing, an articulated arm 122b provided rotatably about a vertical axis with respect to the base 122a, and a hand 122c mounted on the tip of the articulated arm 122b. The hand 122c is structured such that the substrate W can be placed and held on the upper surface thereof. Such an indexer robot including the articulated arm and the hand for holding the substrate is not described in detail since being known.

The substrate processing station 110 includes a mounting table 112 on which the indexer robot 122 places the substrate W, a substrate conveyor robot 111 arranged substantially in a center in a plan view and a plurality of processing units 1 arranged to surround this substrate conveyor robot 11. Specifically, the plurality of processing units 1 are arranged to face a space where the substrate conveyor robot 111 is arranged. The substrate conveyor robot 111 randomly accesses the mounting table 112 for these processing units 1 and transfers the substrate W to and from the mounting table 112. On the other hand, each processing unit 1 performs a predetermined processing to the substrate W, and corresponds to the substrate processing apparatus according to the present invention. In this embodiment, these processing units (substrate processing apparatus) 1 have the same function. Thus, a plurality of the substrates W can be processed in parallel. If the substrate conveyor robot 111 can directly transfer the substrate W from the indexer robot 122, the mounting table 112 is not necessarily required.

Figure 2:
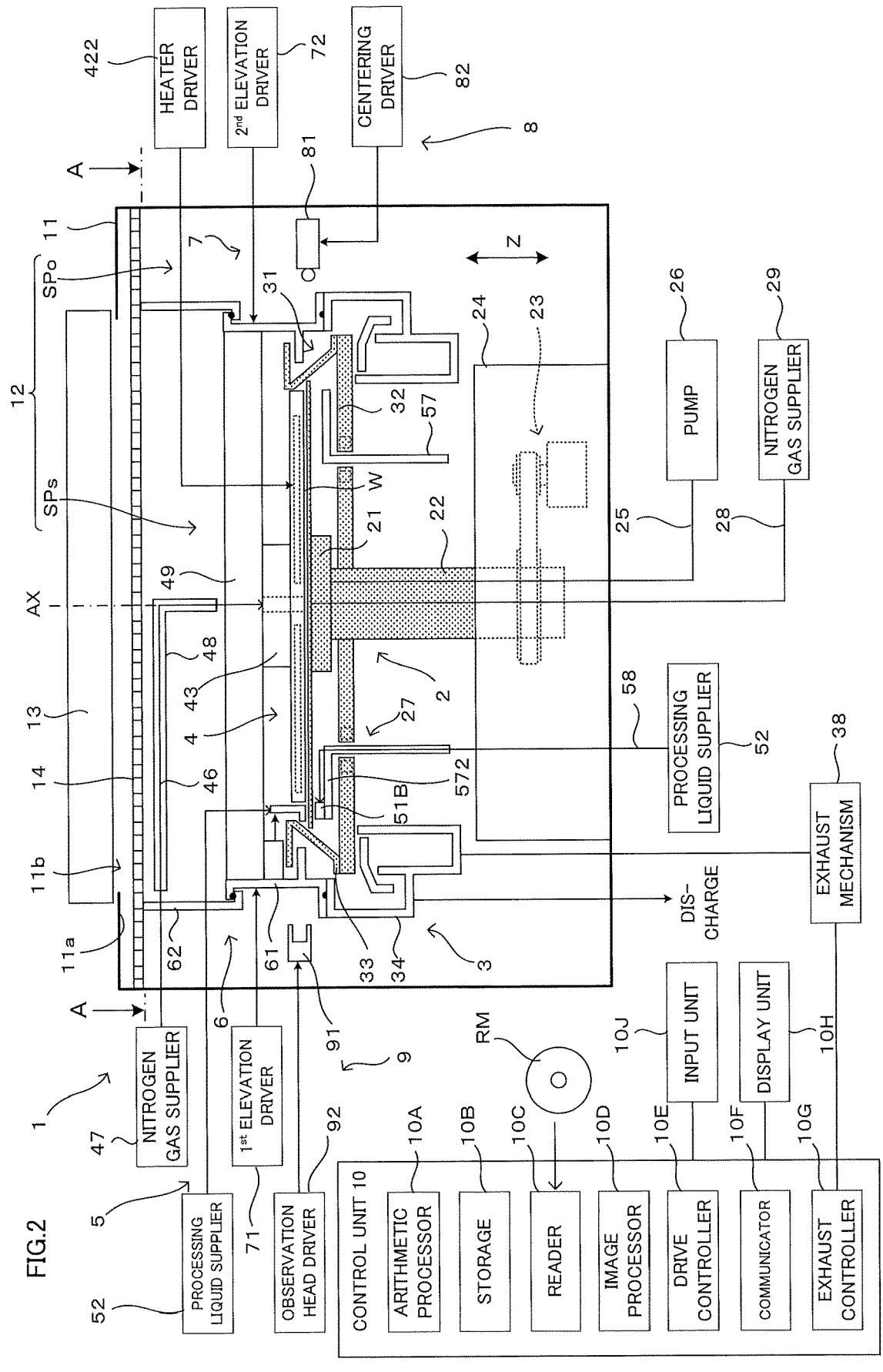
FIG. 2 is a diagram showing the configuration of the first embodiment of the substrate processing apparatus according to the invention.
Figure 3:
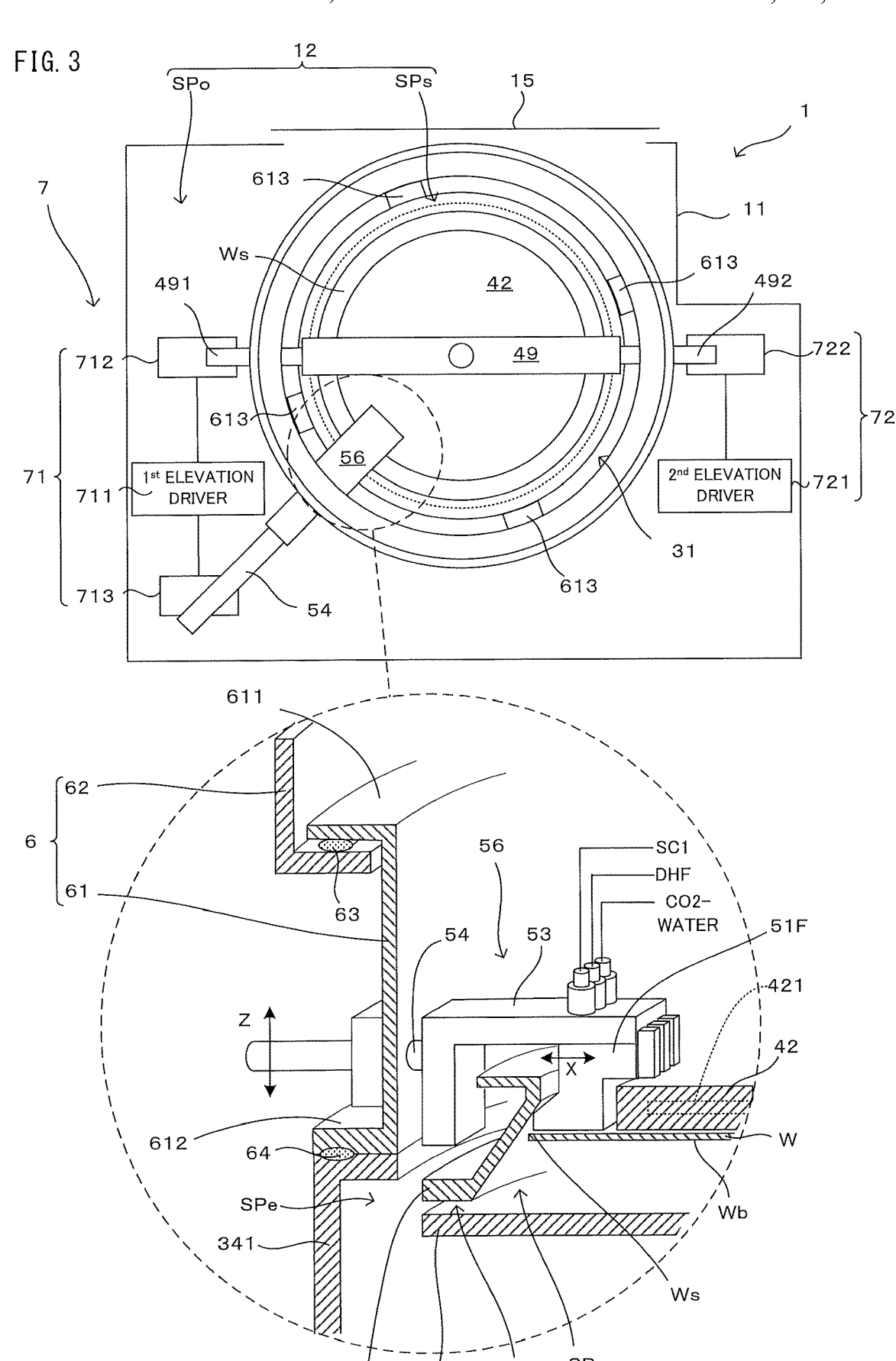
FIG. 3 is a plan view in section along line A-A of FIG. 2.

FIG. 2 is a diagram showing the configuration of the first embodiment of the substrate processing apparatus according to the invention. FIG. 3 is a plan view in section along line A-A of FIG. 2. In FIGS. 2 and 3 and each figure to be referred to below, the dimensions and numbers of respective components may be shown in an exaggerated or simplified manner to facilitate understanding. The substrate processing apparatus (processing unit 1) is provided with a rotating mechanism 2, a scattering preventing mechanism 3, an upper surface protecting/heating mechanism 4, a processing mechanism 5, an atmosphere separating mechanism 6, an elevating mechanism 7, a centering mechanism 8 and a substrate observing mechanism 9. Each of these components is electrically connected to a control unit 10 for controlling the entire apparatus while being stored in an internal space 12 of a chamber 11. Each component 2 to 9 operates in response to an instruction from the control unit 10.

A unit similar to a general computer can be, for example, adopted as the control unit 10. That is, in the control unit 10, each component of the substrate processing apparatus 1 is controlled by a CPU serving as a main controller performing an arithmetic processing in accordance with a procedure described in a program. Note that detailed configuration and operation of the control unit 10 are described in detail later. Further, although the control unit 10 is provided in each substrate processing apparatus 1 in this embodiment, the plurality of substrate processing apparatuses 1 may be configured to be controlled by one control unit. Further, the substrate processing apparatuses 1 may be configured to be controlled by a control unit (not shown) for controlling the entire substrate processing system 100.

As shown in FIG. 2, a fan filter unit (FFU) 13 is attached to a ceiling wall 11a of the chamber 11. This fan filter unit 13 further cleans air in a clean room in which the substrate processing apparatus 1 is installed, and supplies the cleaned air into a processing space in the chamber 11. The fan filter unit 13 includes a fan and a filter (e.g. a HEPA (High Efficiency Particulate Air) filter) for taking in the air in the clean room and feeding the air into the chamber 11, and feeds the cleaned air via an opening 11b provided in the ceiling wall 11a. In this way, a downflow of the cleaned air is formed in the processing space in the chamber 11. Further, a punching plate 14 perforated with a multitude of air outlets is provided right below the ceiling wall 11a to uniformly disperse the cleaned air supplied from the fan filter unit 13.

As shown in FIGS. 1 and 3, a shutter 15 is provided in a side surface of the chamber 11 in the substrate processing apparatus 1. A shutter opening/closing mechanism (not shown) is connected to the shutter 15, and opens or closes the shutter 15 in response to an opening/closing command from the control unit 10. More specifically, in the substrate processing apparatus 1, the shutter opening/closing mechanism opens the shutter 15 in carrying an unprocessed substrate W into the chamber 11, and the unprocessed substrate W is carried in a face-up posture to a spin chuck (substrate holder) 21 of the rotating mechanism 2 by a hand (denoted by RH in FIG. 16A) of a substrate conveyor robot 111. That is, the substrate W is placed on the spin chuck 21 with an upper surface Wf facing up. If the hand of the substrate conveyor robot 111 is retracted from the chamber 11 after the substrate W is carried into, the shutter opening/closing mechanism closes the shutter 15. Then, a bevel processing is performed on the peripheral edge part Ws of the substrate W in the processing space (equivalent to a sealed space SPs to be described in detail later) of the chamber 11. Further, after the bevel processing is finished, the shutter opening/closing mechanism opens the shutter 15 again and the hand of the substrate conveyor robot 111 carries out the processed substrate W from the spin chuck 21. As just described, in this embodiment, the internal space 12 of the chamber 11 is kept in a normal temperature atmosphere. Note that the "normal temperature" means a temperature in a range of 5° C. to 35° C. in this specification.

The rotating mechanism 2 has a function of rotating the substrate W while holding the substrate W substantially in a horizontal posture with the upper surface of the substrate W facing up, and synchronously rotating a part of the scattering preventing mechanism 3 in the same direction as the substrate W. The rotating mechanism 2 rotates the substrate W and a rotating cup 31 of the scattering preventing mechanism 3 about a vertical axis of rotation AX passing through a center of a principal surface. Note that parts to be rotated are dotted in FIG. 2 to clearly show members, parts and the like to be integrally rotated by the rotating mechanism 2.

The rotating mechanism 2 includes the spin chuck 21, which is a disk-like member smaller than the substrate W. The spin chuck 21 is so provided that the upper surface thereof is substantially horizontal and a center axis thereof coincides with the axis of rotation AX. A hollow cylindrical rotary shaft 22 is coupled to the lower surface of the spin chuck 21. The rotary shaft 22 extends in a vertical direction with an axis thereof coinciding with the axis of rotation AX. Further, a rotation driver (e.g. motor) 23 is connected to the rotary shaft 22. The rotation driver 23 rotationally drives the rotary shaft 22 about the axis of the rotary shaft 22 in response to a rotation command from the control unit 10. Therefore, the spin chuck 21 is rotatable about the axis of rotation AX together with the rotary shaft 22. The rotation driver 23 and the rotary shaft 22 provide a function of rotating the spin chuck 21 with the axis of rotation AX as a center and a lower end part of the rotary shaft 22 and the rotation driver 23 are stored in a tubular casing 24.

An unillustrated through hole is provided in a central part of the spin chuck 21 and communicates with an internal space of the rotary shaft 22. A pump 26 is connected to the internal space via a pipe 25 having a valve (not shown) disposed therein. This pump 26 and the valve are electrically connected to the control unit 10 and operate in response to a command from the control unit 10. In this way, a negative pressure and a positive pressure are selectively applied to the spin chuck 21. If the pump 26 applies a negative pressure to the spin chuck 21, for example, with the substrate W placed substantially in a horizontal posture on the upper surface of the spin chuck 21, the spin chuck 21 sucks and holds the substrate W from below. On the other hand, if the pump 26 applies a positive pressure to the spin chuck 21, the substrate W can be taken out from the upper surface of the spin chuck 21. Further, if the suction of the pump 26 is stopped, the substrate W is horizontally movable on the upper surface of the spin chuck 21.

A nitrogen gas supplier 29 is connected to the spin chuck 21 via a pipe 28 provided in a central part of the rotary shaft 22. The nitrogen gas supplier 29 supplies a nitrogen gas at a normal temperature supplied from a utility of a factory, in which the substrate processing system 100 is installed, to the spin chuck 21 at a flow rate and a timing corresponding to a nitrogen gas supply command from the control unit 10, and causes the nitrogen gas to flow from the central part to a radially outer side on the side of a lower surface Wb of the substrate W. Note that although the nitrogen gas is used in this embodiment, another inert gas may be used. This point also applies to a heating gas discharged from a central nozzle to be described later. Further, the "flow rate" means a moving amount of a fluid such as the nitrogen gas per unit time.

Figure 4:
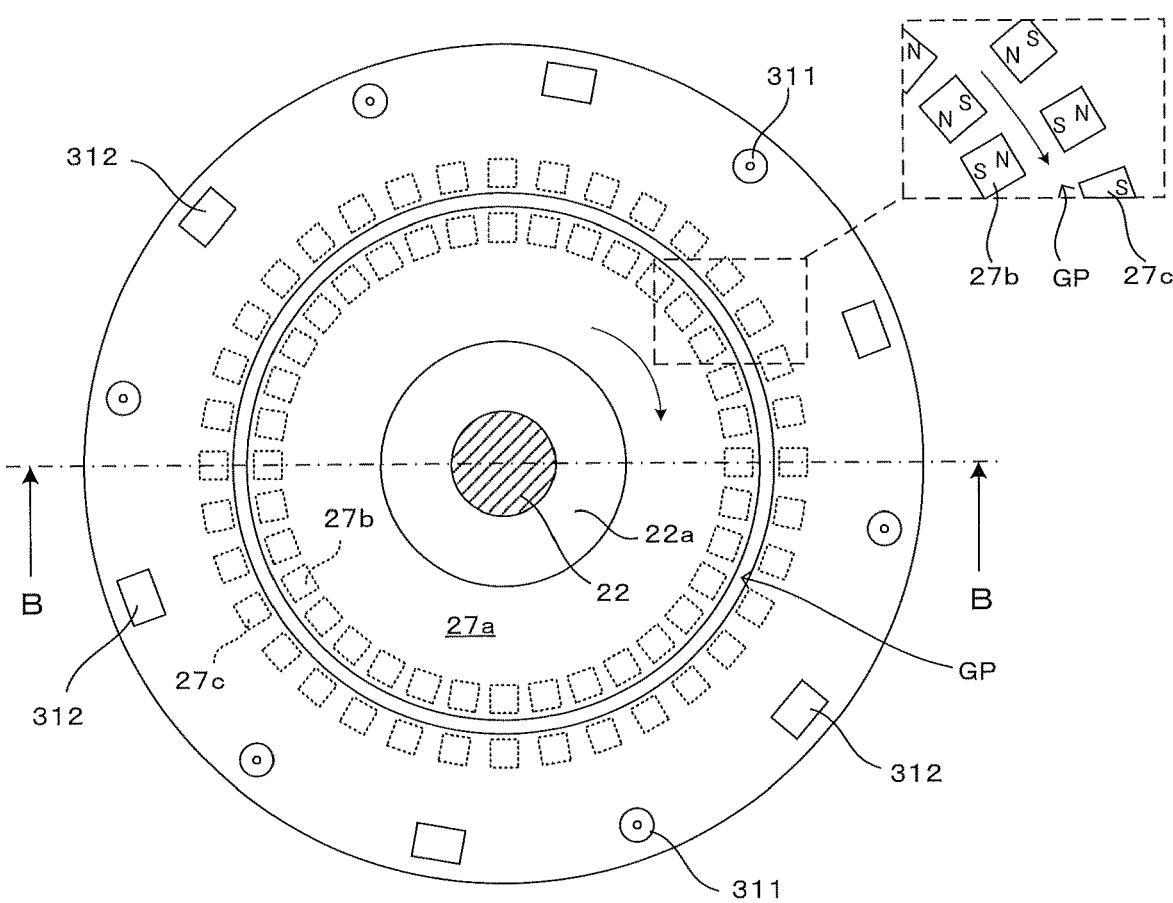
FIG. 4 is a plan view showing the configuration of the power transmitter.
Figure 5:
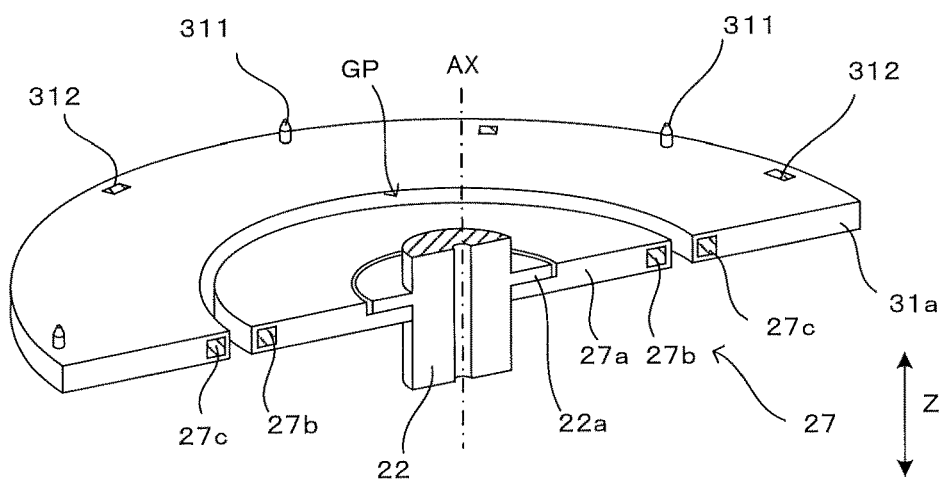
FIG. 5 is a section along line B-B of FIG. 4.

The rotating mechanism 2 includes a power transmitter 27 for not only rotating the spin chuck 21 integrally with the substrate W, but also rotating the rotating cup 31 in synchronization with the former rotation. FIG. 4 is a plan view showing the configuration of the power transmitter, and FIG. 5 is a section along line B-B of FIG. 4. The power transmitter 27 includes an annular member 27a made of a non-magnetic material or resin, magnets 27b built-in the annular member 27a, and magnets 27c built-in a lower cup 32, which is one component of the rotating cup 31. The annular member 27a is attached to the rotary shaft 22 and rotatable about the axis of rotation AX together with the rotary shaft 22. More particularly, the rotary shaft 22 includes a flange part 22a protruding radially outward at a position right below the spin chuck 21 as shown in FIG. 5. The annular member 27a is arranged concentrically with respect to the flange part 22a, and coupled and fixed by an unillustrated bolt or the like.

As shown in FIGS. 4 and 5, a plurality of (36 in this embodiment) the magnets 27b are arranged radially and at equal angular intervals (10° in this embodiment) with the axis of rotation AX as a center on an outer peripheral edge part of the annular member 27*a*. In this embodiment, as shown in an enlarged view of FIG. 4, an N-pole and an S-pole are respectively arranged on an outer side and an inner side of one of the two magnets 27*b* adjacent to each other, and an S-pole and an N-pole are respectively arranged on an outer side and an inner side of the other magnet.

Similarly to these magnets 27*b*, a plurality of (36 in this embodiment) the magnets 27*c* are arranged radially and at equal angular intervals (10° in this embodiment) with the axis of rotation AX as a center. These magnets 27*c* are built in the lower cup 32. The lower cup 32 is a constituent component of the scattering preventing mechanism 3 to be described next and, as shown in FIGS. 4 and 5, has an annular shape. That is, the lower cup 32 has an inner peripheral surface capable of facing the outer peripheral surface of the annular member 27*a*. An inner diameter of this inner peripheral surface is larger than an outer diameter of the annular member 27*a*. The lower cup 32 is arranged concentrically with the rotary shaft 22 and the annular member 27*a* while this inner peripheral surface is separated from the outer peripheral surface of the annular member 27*a* by a predetermined distance (=(the inner diameter–the outer diameter)/2) and facing the outer peripheral surface of the annular member 27*a*. Engaging pins 35 and coupling magnets 36 are provided on the upper surface of the outer peripheral edge of the lower cup 32, the upper cup 33 is coupled to the lower cup 32 by these, and this coupled body functions as the rotating cup 31. This point is described in detail later.

The lower cup 32 is supported rotatably about the axis of rotation AX while being kept in the above arranged state by a bearing not shown in figures. As shown in FIGS. 4 and 5, the plurality of (36 in this embodiment) magnets 27*c* are arranged radially and at equal angular intervals (10° in this embodiment) with the axis of rotation AX as a center on an inner peripheral edge part of this lower cup 32. Further, two magnets 27*c* adjacent to each other are arranged similarly to the magnets 27*b*. That is, an N-pole and an S-pole are respectively arranged on an outer side and an inner side of one magnet, and an S-pole and an N-pole are respectively arranged on an outer side and an inner side of the other magnet.

In the power transmitter 27 thus configured, if the annular member 27*a* is rotated together with the rotary shaft 22 by the rotation driver 23, the lower cup 32 rotates in the same direction as the annular member 27*a* while maintaining an air gap GPa (gap between the annular member 27*a* and the lower cup 32) by the action of magnetic forces between the magnets 27*b* and 27*c*. In this way, the rotating cup 31 rotates about the axis of rotation AX. That is, the rotating cup 31 rotates in the same direction as and in synchronization with the substrate W.

The scattering preventing mechanism 3 includes the rotating cup 31 rotatable about the axis of rotation AX while surrounding the outer periphery of the substrate W held on the spin chuck 21 and a fixed cup 34 fixedly provided to surround the rotating cup 31. The rotating cup 31 is provided rotatably about the axis of rotation AX while surrounding the outer periphery of the rotating substrate W by the upper cup 33 being coupled to the lower cup 32.

Figure 6:
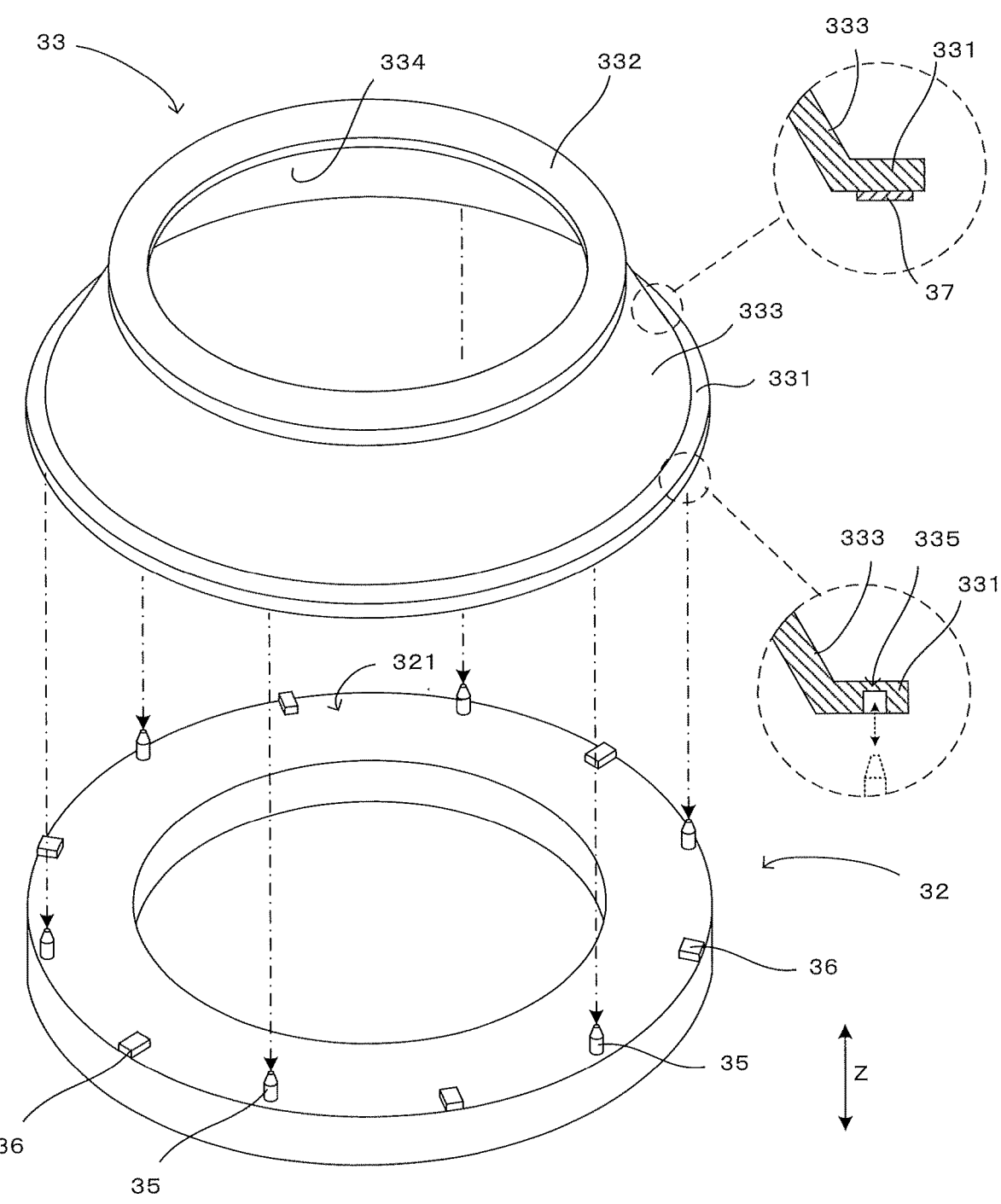
FIG. 6 is an exploded assembly perspective view showing the structure of the rotating cup.
Figure 7:
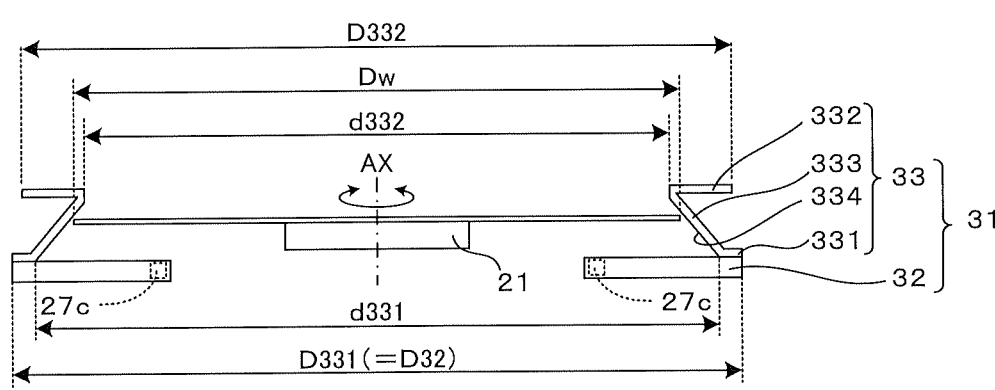
FIG. 7 is a diagram showing a dimensional relationship of the substrate held on the spin chuck and the rotating cup.
Figure 8:
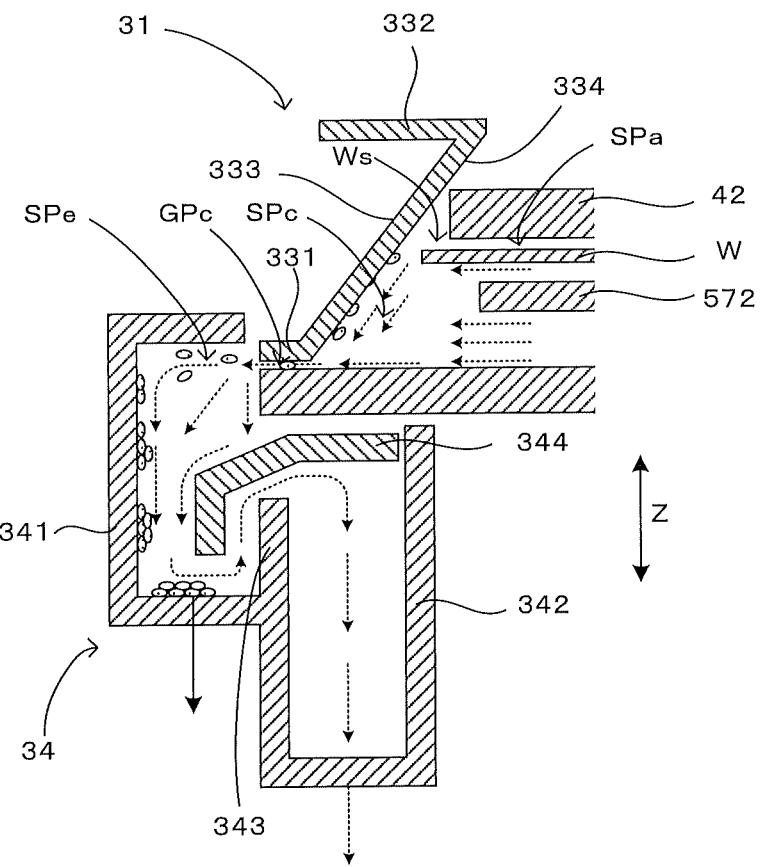
FIG. 8 is a diagram showing parts of the rotating cup and the fixed cup.

FIG. 6 is an exploded assembly perspective view showing the structure of the rotating cup. FIG. 7 is a diagram showing a dimensional relationship of the substrate held on the spin chuck and the rotating cup. FIG. 8 is a diagram showing parts of the rotating cup and the fixed cup. The lower cup 32 has an annular shape. The lower cup 32 has an outer diameter larger than that of the substrate W and is arranged rotatably about the axis of rotation AX while radially protruding from the substrate W held on the spin chuck 21 in a plan view vertically from above. In this protruding region, i.e. an upper surface peripheral edge part 321 of the lower cup 32, the engaging pins 35 standing vertically upward and the flat plate-like lower magnets 36 are alternately mounted along a circumferential direction. A total of three engaging pins 35 are mounted, and a total of three lower magnets 36 are mounted. These engaging pins 35 and lower magnets 36 are arranged radially and at equal angular intervals (60° in this embodiment) with the axis of rotation AX as a center.

On the other hand, as shown in FIGS. 2, 3, 6 and 7, the upper cup 33 includes a lower annular part 331, an upper annular part 332 and an inclined part 333 coupling these. An outer diameter D331 of the lower annular part 331 is equal to an outer diameter D32 of the lower cup 32 and, as shown in FIG. 6, the lower annular part 331 is located vertically above the peripheral edge part 321 of the lower cup 32. Recesses 335 open downward are provided to be fittable to tip parts of the engaging pins 35 in regions vertically above the engaging pins 35 on the lower surface of the lower annular part 331. Further, upper magnets 37 are mounted in regions vertically above the lower magnets 36. Thus, the upper cup 33 is engageable with and disengageable from the lower cup 32 with the recesses 335 and the upper magnets 37 respectively facing the engaging pins 35 and the lower magnets 36 as shown in FIG. 6. Note that a relationship of the recesses and the engaging pins may be reversed. Further, magnets may be provided on one side and ferromagnets may be provided on the other side, besides a combination of the lower magnets 36 and the upper magnets 37.

The upper cup 33 is movable up and down along the vertical direction by the elevating mechanism 7. If the upper cup 33 is moved up by the elevating mechanism 7, a conveyance space (SPt in FIG. 16A) for carrying in and out the substrate W is formed between the upper cup 33 and the lower cup 32 in the vertical direction. On the other hand, if the upper cup 33 is moved down by the elevating mechanism 7, the recesses 335 are fit to cover the tip parts of the engaging pins 35 and the upper cup 33 is positioned in a horizontal direction with respect to the lower cup 32. Further, the upper magnets 37 approach the lower magnets 36, and the positioned upper and lower cups 33, 32 are bonded to each other by attraction forces generated between the both magnets. In this way, as shown in a partial enlarged view of FIG. 3 and FIG. 8, the upper and lower cups 33, 32 are integrated in the vertical direction with a gap GPc extending in the horizontal direction formed. The rotating cup 31 is rotatable about the axis of rotation AX while forming the gap GPc.

In the rotating cup 31, an outer diameter D332 of the upper annular part 332 is slightly smaller than the outer diameter D331 of the lower annular part 331 as shown in FIG. 7. Further, if diameters d331, d332 of the inner peripheral surfaces of the lower and upper annular parts 331, 332 are compared, the lower annular part 331 is larger than the upper annular part 332 and the inner peripheral surface of the upper annular part 332 is located inside the inner peripheral surface of the lower annular part 331 in a plan view vertically from above. The inner peripheral surface of the upper annular part 332 and that of the lower annular part 331 are coupled by the inclined part 333 over the entire circumference of the upper cup 33. Thus, the inner peripheral surface of the inclined part 333, i.e. a surface surrounding the substrate W, serves as an inclined surface 334. That is, as shown in FIG. 8, the inclined part 333 can collect liquid droplets scattered from the substrate W by surrounding the outer periphery of the rotating substrate W, and a space surrounded by the upper and lower cups 33, 32 functions as a collection space SPc.

Moreover, the inclined part 333 facing the collection space SPc is inclined upwardly of the peripheral edge part of the substrate W from the lower annular part 331. Thus, as shown in FIG. 8, the liquid droplets collected by the inclined part 333 can flow to a lower end part of the upper cup 33, i.e. the lower annular part 331, along the inclined surface 334, and can be discharged to the outside of the rotating cup 31 via the gap GPc.

The fixed cup 34 is provided to surround the rotating cup 31 and forms a discharge space SPe. The fixed cup 34 includes a liquid receiving part 341 and an exhaust part 342 provided inside the liquid receiving part 341. The liquid receiving part 341 has a cup structure open to face an opening (left opening of FIG. 8) of the gap GPc on a side opposite to the substrate. That is, an internal space of the liquid receiving part 341 functions as the discharge space SPe and communicates with the collection space SPc via the gap GPc. Therefore, the liquid droplets collected by the rotating cup 31 are guided into the discharge space SPe via the gap GPc together with gas components. Then, the liquid droplets are collected in a bottom part of the liquid receiving part 341 and discharged from the fixed cup 34.

On the other hand, the gas components are collected into the exhaust part 342. This exhaust part 342 is partitioned from the liquid receiving part 341 via a partition wall 343. Further, a gas guiding part 344 is arranged above the partition wall 343. The gas guiding part 344 extends from a position right above the partition wall 343 into the discharge space SPe and the exhaust part 342, thereby forming a flow passage for gas components having a labyrinth structure by covering the partition wall 343 from above. Accordingly, the gas components, out of a fluid flowing into the liquid receiving part 341, are collected in the exhaust part 342 by way of the flow passage. This exhaust part 342 is connected to an exhaust mechanism 38. Thus, a pressure in the fixed cup 34 is adjusted by the operation of the exhaust mechanism 38 in response to a command from the control unit 10, and the gas components in the exhaust part 342 are efficiently exhausted. Further, a pressure and a flow rate in the discharge space SPe are adjusted by a precise control of the exhaust mechanism 38. For example, the pressure in the discharge space SPe is reduced to below that in the collection space SPc. As a result, the liquid droplets in the collection space SPc can be efficiently drawn into the discharge space SPe and movements of the liquid droplets from the collection space SPc can be promoted.

Figure 9:
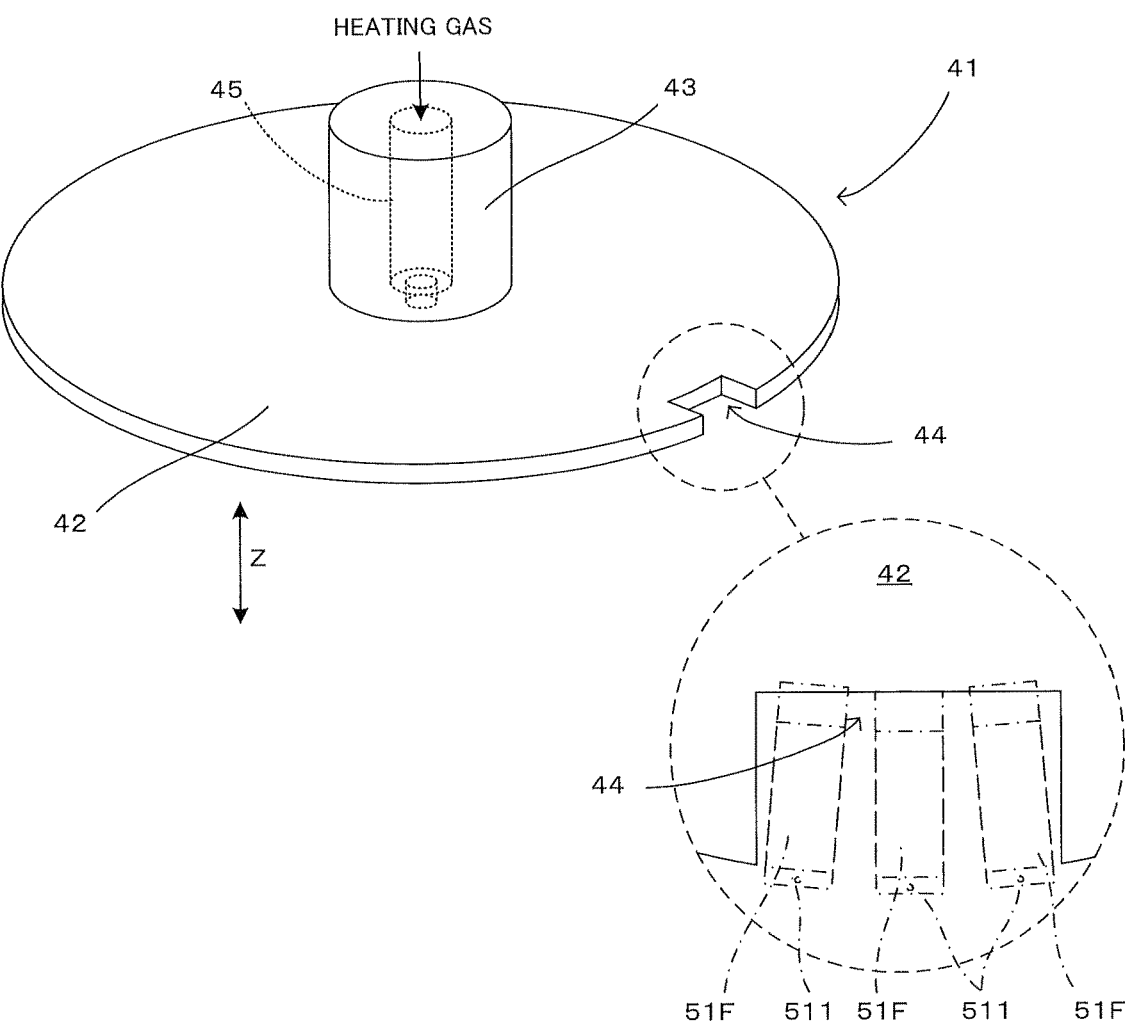
FIG. 9 is an external perspective view showing the configuration of the upper surface protecting/heating mechanism.
Figure 10:
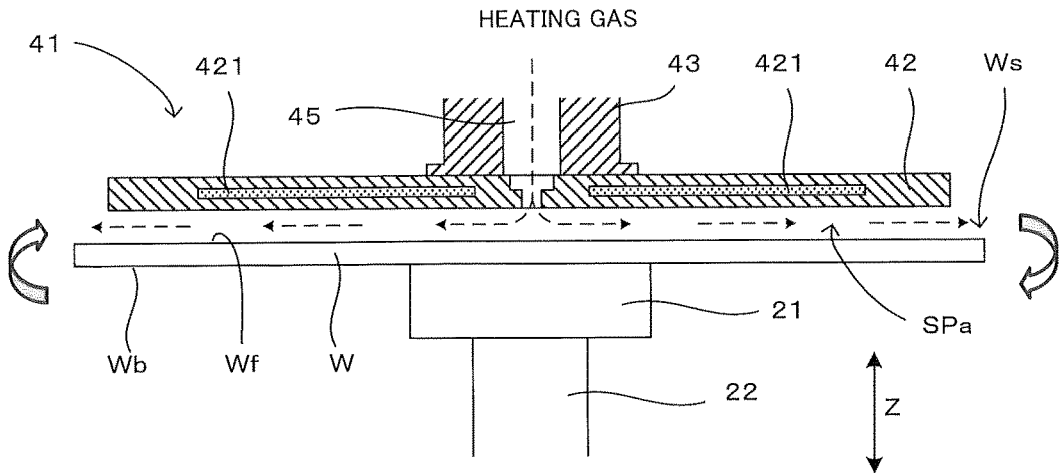
FIG. 10 is a sectional view of the upper surface protecting/heating mechanism shown in FIG. 9.

FIG. 9 is an external perspective view showing the configuration of the upper surface protecting/heating mechanism. FIG. 10 is a sectional view of the upper surface protecting/heating mechanism shown in FIG. 9. The upper surface protecting/heating mechanism 4 includes a shielding plate 41 arranged above the upper surface Wf of the substrate W held on the spin chuck 21. This shielding plate 41 includes a disk part 42 held in a horizontal posture. The disk part 42 has a built-in heater 421 drive-controlled by a heater driver 422. This disk part 42 has a diameter slightly shorter than that of the substrate W. The disk part 42 is so supported by a support member 43 that the lower surface of the disk part 42 covers a surface region excluding the peripheral edge part Ws, out of the upper surface Wf of the substrate W, from above. Note that reference sign 44 in FIG. 9 denotes a cut provided in a peripheral edge part of the disk part 42, and this cut is provided to prevent interference with processing liquid discharge nozzles included in the processing mechanism 5. The cut 44 is open radially outward.

A lower end part of the support member 43 is mounted in a central part of the disk part 42. The cylindrical through hole is formed to vertically penetrate through the support member 43 and the disk part 42. Further, a center nozzle 45 is vertically inserted into this through hole. As shown in FIG. 2, the nitrogen gas supplier 47 is connected to this center nozzle 45 via a pipe 46. The nitrogen gas supplier 47 supplies a nitrogen gas at a normal temperature supplied from utilities of the factory in which the substrate processing system 100 is installed, to the center nozzle 45 at a flow rate and a timing corresponding to a nitrogen gas supply command from the control unit 10. Further, in this embodiment, a ribbon heater 48 is mounted in a part of the pipe 46. The ribbon heater 48 generates heat in response to a heating command from the control unit 10 to heat the nitrogen gas flowing in the pipe 46.

The nitrogen gas (hereinafter, referred to as a "heating gas") heated in this way is fed under pressure toward the center nozzle 45 and discharged from the center nozzle 45. For example, as shown in FIG. 10, by supplying the heating gas with the disk part 42 positioned at a processing position near the substrate W held on the spin chuck 21, the heating gas flows toward a peripheral edge part from a central part of the space SPa sandwiched between the upper surface Wf of the substrate W and the disk part 42 including the built-in heater. In this way, an atmosphere around the substrate W can be suppressed from reaching the upper surface Wf of the substrate W. As a result, the liquid droplets included in the atmosphere can be effectively prevented from getting in the space SPa sandwiched between the substrate W and the disk part 42. Further, the upper surface Wf is entirely heated by heating of the heater 421 and the heating gas, whereby an in-plane temperature of the substrate W can be made uniform. In this way, the warping of the substrate W can be suppressed and a liquid landing position of the processing liquid can be stabilized. Note that the temperature and flow rate of the heating gas supplied to the center nozzle 45 are desirably controlled to obtain these effects. This point is described in detail based on a simulation result (FIGS. 21 to 24) and the like later.

As shown in FIG. 2, an upper end part of the support member 43 is fixed to a beam member 49 extending in a horizontal direction orthogonal to a substrate conveying direction (lateral direction of FIG. 3) along which the substrate W is carried in and out. This beam member 49 is connected to the elevating mechanism 7 and moved up and down by the elevating mechanism 7 in response to a command from the control unit 10. For example, in FIG. 2, the beam member 49 is positioned below, whereby the disk part 42 coupled to the beam member 49 is located at the processing position via the support member 43. On the other hand, if the elevating mechanism 7 moves up the beam member 49 in response to a move-up command from the control unit 10, the beam member 49, the support member 43 and the disk part 42 integrally move upward and the upper cup 33 is also linked, separated from the lower cup 32 and moves up. In this way, the upper cup 33 and the disk part 42 are spaced wider apart from the spin chuck 21 and the substrate W can be carried to and from the spin chuck 21 (see FIG. 16A).

Figures 11, 12:
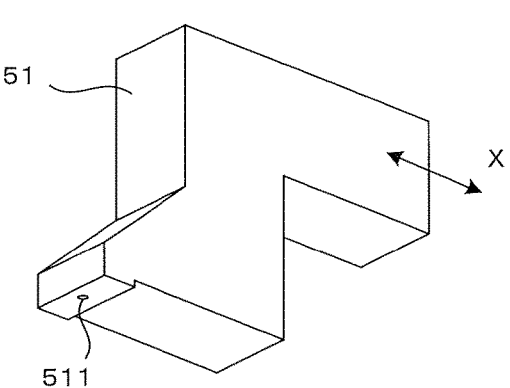
FIG. 11 is a perspective view showing the processing liquid discharge nozzle on an upper surface side equipped in the processing mechanism.
FIG. 12 is a diagram showing nozzle positions in a bevel processing mode and a pre-dispense mode.
Figure 13:
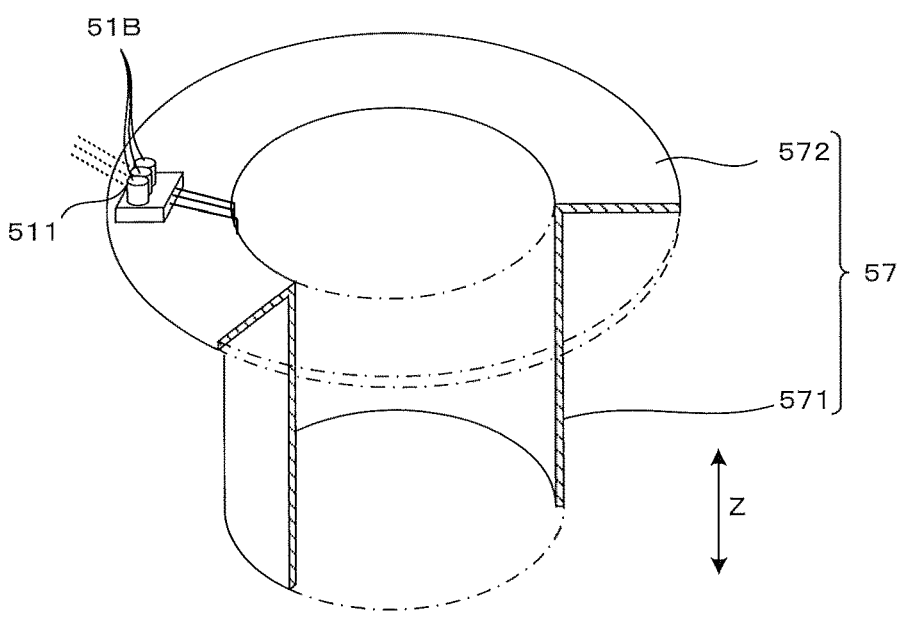
FIG. 13 is a perspective view showing processing liquid discharge nozzles on a lower surface side equipped in the processing mechanism and a nozzle support for supporting these nozzles.

FIG. 11 is a perspective view showing the processing liquid discharge nozzle on an upper surface side equipped in the processing mechanism. FIG. 12 is a diagram showing nozzle positions in a bevel processing mode and a pre-dispense mode. FIG. 13 is a perspective view showing processing liquid discharge nozzles on a lower surface side equipped in the processing mechanism and a nozzle support for supporting these nozzles. The processing mechanism 5 includes processing liquid discharge nozzles 51F arranged on the upper surface side of the substrate W, processing liquid discharge nozzles 51B arranged on the lower surface side of the substrate W and processing liquid suppliers 52 for supplying the processing liquid to the processing liquid discharge nozzles 51F, 51B. The lower processing liquid discharge nozzles 51F on the upper surface side and the processing liquid discharge nozzles 51B on the lower surface side are respectively referred to as "upper surface nozzles 51F" and "lower surface nozzles 51B" to be distinguished. Further, two processing liquid suppliers 52 shown in FIG. 2 are identical.

In this embodiment, three upper surface nozzles 51F are provided, and the processing liquid supplier 52 is connected to those. Further, the processing liquid supplier 52 is configured to be capable of supplying SC1, DHF and functional water ($CO_2$ water or the like) as the processing liquids, and the SC1, DHF and functional water can be respectively independently discharged from the three upper surface nozzles 51F.

As shown in FIG. 11, each upper surface nozzle 51F is provided with a discharge port 511 for discharging the processing liquid in the lower surface of a tip. As shown in the enlarged view of FIG. 3, lower parts of a plurality of (three in this embodiment) upper surface nozzles 51F are arranged in the cut 44 of the disk part 42 and upper parts of the upper surface nozzles 51F are mounted movably in a radial direction X of the substrate W with respect to a nozzle holder 53 with the respective discharge ports 511 facing the peripheral edge part of the upper surface Wf of the substrate W. This nozzle holder 53 is supported by a support member 54, and this support member 54 is fixed to a lower sealing cup member 61 of the atmosphere separating mechanism 6. That is, the upper surface nozzles 51F and the nozzle holder 53 are integrated with the lower sealing cup member 61 via the support member 54, and moved up and down along the vertical direction Z together with the lower sealing cup member 61 by the elevating mechanism 7. Note that the elevating mechanism 7 is described in detail later.

As shown in FIGS. 3 and 12, the nozzle holder 53 includes a built-in nozzle mover 55 for collectively moving the upper surface nozzles 51F in the radial direction X. Accordingly, the nozzle mover 55 collectively drives the three upper surface nozzles 51F in the direction X in response to a position command from the control unit 10. In this way, the upper surface nozzles 51F reciprocally move between a bevel processing position shown in FIG. 12(a) and a pre-dispense position shown in FIG. 12(b). The discharge ports 511 of the nozzle mover 55 positioned at this bevel processing position are facing the peripheral edge part of the upper surface Wf of the substrate W. If the processing liquid supplier 52 supplies the processing liquid corresponding to a supply command, out of three kinds of processing liquids, to the upper surface nozzle 51F for the processing liquid in response to the supply command from the control unit 10, the processing liquid is discharged to the peripheral edge part of the upper surface Wf of the substrate W from the discharge port 511 of this upper surface nozzle 51F.

On the other hand, the discharge ports 511 of the upper surface nozzles 51F positioned at the pre-dispense position are located above the peripheral edge part of the upper surface Wf and facing the inclined surface 334 of the upper cup 33. If the processing liquid supplier 52 supplies all or part of the processing liquid to the corresponding upper surface nozzle 51F in response to a supply command from the control unit 10, this processing liquid is discharged to the inclined surface 334 of the upper cup 33 from the discharge port 511 of this upper surface nozzle 51F. In this way, the pre-dispense processing is performed. Note that the liquid droplets of the processing liquids used in the bevel processing and the pre-dispense processing are collected by the upper cup 33 and discharged into the discharge space SPe via the gap GPc as shown in FIG. 12. reference sign 56 in FIG. 12 denotes a structure composed of the upper surface nozzles 51F and the nozzle holder 53 including the built-in nozzle mover 55, and referred to as a "nozzle head 56" below. Further, although only the upper surface nozzles 51F are mounted in the nozzle head 56, a gas discharge nozzle for discharging an inert gas such as a nitrogen gas may be additionally equipped and purge the processing liquid remaining on the peripheral edge part Ws without separating with the inert gas from the gas discharge nozzle, for example, while the substrate W is making one turn.

In this embodiment, the lower surface nozzles 51B and a nozzle support 57 are provided below the substrate W held on the spin chuck 21 to discharge the processing liquid toward the peripheral edge part of the lower surface Wb of the substrate W. As shown in FIG. 13, the nozzle support 57 includes a thin hollow cylindrical part 571 extending in the vertical direction and a flange part 572 having an annular shape and bent to expand radially outward in an upper end part of the hollow cylindrical part 571. The hollow cylindrical part 571 is shaped to be loosely insertable into the air gap GPa formed between the annular member 27a and the lower cup 32. As shown in FIG. 2, the nozzle support 57 is so fixedly arranged that the hollow cylindrical part 571 is loosely inserted in the air gap GPa and the flange part 572 is located between the substrate W supported on the spin chuck 21 and the lower cup 32. Three lower surface nozzles 51B are mounted on a peripheral edge part of the upper surface of the flange part 572. Each lower surface nozzle 51B includes a discharge port 511 open toward the peripheral edge part of the lower surface Wb of the substrate W and can discharge the processing liquid supplied from the processing liquid supplier 52 via a pipe 58.

The bevel processing for the peripheral edge part of the substrate W is performed by the processing liquids discharged from these upper surface nozzles 51F and lower surface nozzles 51B. Further, on the lower surface side of the substrate W, the flange part 572 is extended to the vicinity of the peripheral edge part Ws. Thus, the nitrogen gas supplied to the lower surface side via the pipe 28 flows into the collection space SPc along the flange part 572 as shown in FIG. 8. As a result, a backflow of the liquid droplets from the collection space SPc to the substrate W is effectively suppressed.

Figure 14:
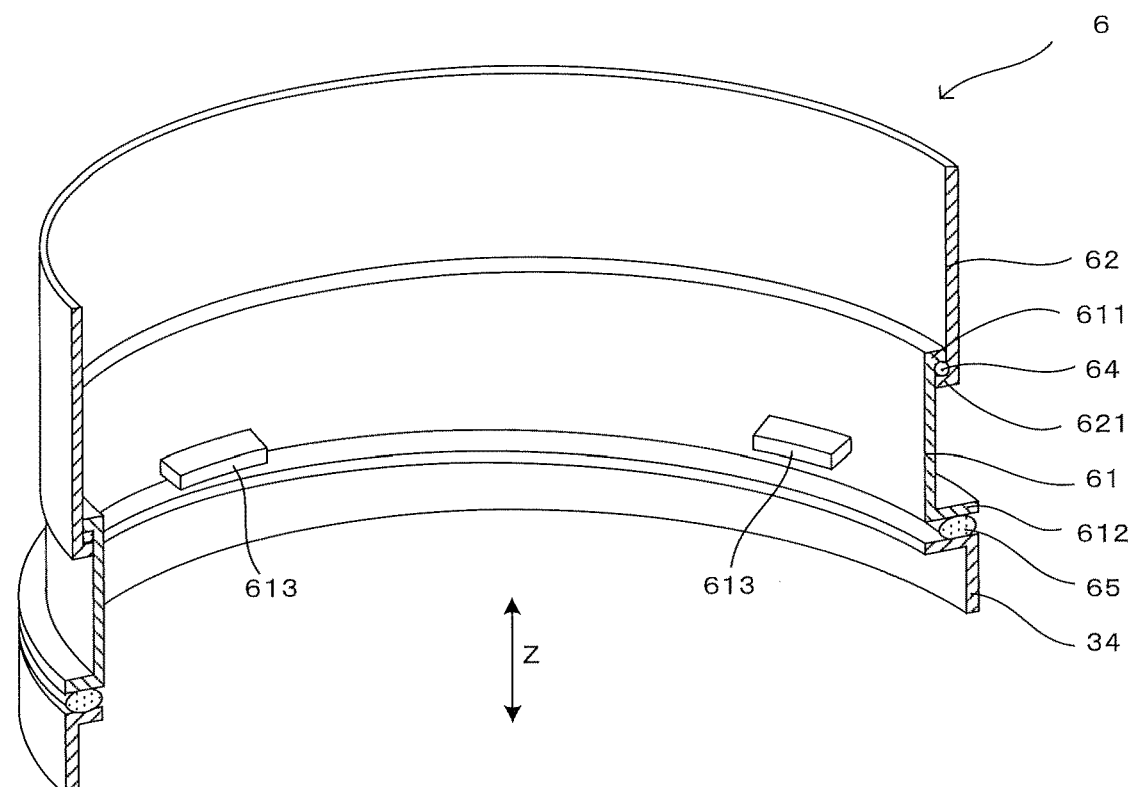
FIG. 14 is a partial sectional view showing the configuration of the atmosphere separating mechanism.

FIG. 14 is a partial sectional view showing the configuration of the atmosphere separating mechanism. The atmosphere separating mechanism 6 includes the lower sealing cup member 61 and an upper sealing cup member 62. Both of the upper and lower sealing cup members 61, 62 have a tube shape open in the vertical direction. Inner diameters of those are larger than an outer diameter of the rotating cup 31, and the atmosphere separating mechanism 6 is arranged to completely surround the spin chuck 21, the substrate W held on the spin chuck 21, the rotating cup 31 and the upper surface protecting/heating mechanism 4 from above. More particularly, as shown in FIG. 2, the upper sealing cup member 62 is fixedly arranged at a position right below the punching plate 14 such that the upper opening thereof covers the opening 11*b* of the ceiling wall 11*a* from below. Thus, a downflow of clean air introduced into the chamber 11 is separated into a flow passing through the inside of the upper sealing cup member 62 and a flow passing outside the upper sealing cup member 62.

Further, a lower end part of the upper sealing cup member 62 includes a flange part 621 bent inwardly and having an annular shape. An O-ring 63 is mounted on the upper surface of this flange part 611. The lower sealing cup member 61 is arranged movably in the vertical direction inside the upper sealing cup member 62.

An upper end part of the lower sealing cup member 61 includes a flange part 611 bent to expand outward and having an annular shape. The flange part 611 overlaps the flange part 621 in a plan view vertically from above. Thus, if the lower sealing cup member 61 moves down, the flange part 611 of the lower sealing cup member 61 is locked by the flange part 621 of the upper sealing cup member 62 via the O-ring 63 as shown in FIGS. 3 and 14. In this way, the lower sealing cup member 61 is positioned at a lower limit position. At this lower limit position, the upper and lower sealing cup members 62, 61 are connected in the vertical direction, and a downflow introducing into the upper sealing cup member 62 is guided toward the substrate W held on the spin chuck 21.

A lower end part of the lower sealing cup member 61 includes a flange part 612 bent outwardly and having an annular shape. This flange part 612 overlaps an upper end part of the fixed cup 34 (upper end part of the liquid receiving part 341) in a plan view vertically from above. Thus, at the lower limit position, the flange part 612 of the lower sealing cup member 61 is locked by the fixed cup 34 via an O-ring 64 as shown in the enlarged view of FIG. 3 and FIG. 14. In this way, the lower sealing cup member 61 and the fixed cup 34 are connected in the vertical direction, and a sealed space SPs is formed by the upper sealing cup member 62, the lower sealing cup member 61 and the fixed cup 34. The bevel processing on the substrate W can be performed in this sealed space SPs. That is, by positioning the lower sealing cup member 61 at the lower limit position, the sealed space SPs is separated from an outside space SPo of the sealed space SPs (atmosphere separation). Therefore, the bevel processing can be stably performed without being influenced by an outside atmosphere. Further, the processing liquids are used to perform the bevel processing. The processing liquids can be reliably prevented from leaking from the sealed space SPs to the outside space SPo. Thus, a degree of freedom in selecting/designing components to be arranged in the outside space SPo is enhanced.

The lower sealing cup member 61 is also configured to be movable vertically upward. The nozzle head 56 (=upper surface nozzles 51F+nozzle holder 53) is fixed to an intermediate part of the lower sealing cup member 61 in the vertical direction via the support member 54 as described above. Besides this, as shown in FIGS. 2 and 3, the upper surface protecting/heating mechanism 4 is fixed to an intermediate part of the lower sealing cup member 61 via the beam member 49. That is, as shown in FIG. 3, the lower sealing cup member 61 is connected to one end part of the beam member 49, the other end part of the beam member 49 and the support member 54 at three positions mutually different in the circumferential direction. By moving up and down the one end part of the beam member 49, the other end part of the beam member 49 and the support member 54 by the elevating mechanism 7, the lower sealing cup member 61 is also moved up and down accordingly.

As shown in FIGS. 2, 3 and 4, a plurality of (four) projections 613 are provided to project inward as engaging parts engageable with the upper cup 33 on the inner peripheral surface of the lower sealing cup member 61. Each projection 613 extends to a space below the upper annular part 332 of the upper cup 33. Further, each projection 613 is so mounted to be separated downward from the upper annular part 332 of the upper cup 33 with the lower sealing cup member 61 positioned at the lower limit position. By an upward movement of the lower sealing cup member 61, each projection 613 is engageable with the upper annular part 332 from below. The lower sealing cup member 61 moves further upward also after this engagement, whereby the upper cup 33 can be separated from the lower cup 32.

In this embodiment, after the lower sealing cup member 61 starts to be moved up together with the upper surface protecting/heating mechanism 4 and the nozzle head 56 by the elevating mechanism 7, the upper cup 33 also moves up. In this way, the upper cup 33, the upper surface protecting/heating mechanism 4 and the nozzle head 56 are separated upward from the spin chuck 21. By a movement of the lower sealing cup member 61 to a retracted position (position in FIG. 16A to be described later), the conveyance space (SPt in FIG. 16A) for allowing the hand (RH in FIG. 16A) of the substrate conveyor robot 111 to access the spin chuck 21 is formed. The substrate W can be loaded onto the spin chuck 21 and unloaded from the spin chuck 21 via this conveyance space. As just described, in this embodiment, the substrate W can access the spin chuck 21 by a minimum upward movement of the lower sealing cup member 61 by the elevating mechanism 7.

The elevating mechanism 7 includes two elevation drivers 71, 72. In the elevation driver 71, a first elevation motor 711 is provided as shown in FIG. 3. The first elevation motor 711 generates a rotational force by operating in response to a drive command from the control unit 10. Two elevators 712, 713 are coupled to this first elevation motor 711. The elevators 712, 713 simultaneously receive the rotational force from the first elevation motor 711. Then, the elevator 712 moves up and down a support member 491 supporting the one end part of the beam member 49 along the vertical direction Z according to a rotation amount of the first elevation motor 711. Further, the elevator 713 moves up and down the support member 54 supporting the nozzle head 56 along the vertical direction Z according to the rotation amount of the first elevation motor 711.

The elevation driver 72 includes a second elevation motor 721 and an elevator 722 as shown in FIG. 3. The second elevation motor 721 generates a rotational force by operating in response to a drive command from the control unit 10 and gives the generated rotational force to the elevator 722. The elevator 722 moves up and down a support member 492 supporting the other end part of the beam member 49 along the vertical direction Z according to a rotation amount of the second elevation motor 721.

The elevation drivers 71, 72 synchronously and vertically move the support members 491, 492 and 54 respectively fixed to the side surface of the lower sealing cup member 61 at three positions mutually different in the circumferential direction. Therefore, the upper surface protecting/heating mechanism 4, the nozzle head 56 and the lower sealing cup member 61 can be stably moved up and down. Further, the upper cup 33 can be also stably moved up and down as the lower sealing cup member 61 is moved up and down.

The centering mechanism 8 includes contact members 81 capable of moving toward and away from an end surface of the substrate W loaded on the spin chuck 21, and a centering driver 82 for horizontally moving the contact members 81. In this embodiment, three contact members 81 are arranged radially and at equal angular interval with the axis of rotation AX as a center, and only one of those is shown in FIG. 2. In this centering mechanism 8, the centering driver 82 moves the contact members 81 toward the substrate W in response to a centering command from the control unit 10 (centering processing) while suction by the pump 26 is stopped (i.e. while the substrate W is horizontally movable on the upper surface of the spin chuck 21). By this centering processing, the eccentricity of the substrate W with respect to the spin chuck 21 is eliminated and a center of the substrate W and that of the spin chuck 21 coincide.

The substrate observing mechanism 9 includes an observation head 91 for observing the peripheral edge part of the substrate W. This observation head 91 is configured to approach to and separate from the peripheral edge part of the substrate W. An observation head driver 92 is connected to the observation head 91. In observing the peripheral edge part of the substrate W by the observation head 91, the observation head driver 92 moves the observation head 91 toward the substrate W in response to an observation command from the control unit 10 (observation processing). Then, the peripheral edge part of the substrate W is imaged using the observation head 91. A captured image is sent to the control unit 10. Whether or not the bevel processing has been satisfactorily performed is inspected based on this image by the control unit 10.

The control unit 10 includes an arithmetic processor 10A, a storage 10B, a reader 10C, an image processor 10D, a drive controller 10E, a communicator 10F and an exhaust controller 10G. The storage 10B is constituted by a hard disk drive or the like, and stores a program for performing the bevel processing by the substrate processing apparatus 1. This program is stored, for example, in a computer-readable recording medium RM (e.g. an optical disk, a magnetic disk, a magneto-optical disk, or the like), read from the recording medium RM by the reader 10C and saved in the storage 10B. Further, the program may be provided, for example, via an electrical communication line without being limited to provision via the recording medium RM. The image processor 10D applies various processings to an image captured by the substrate observing mechanism 9. The drive controller 10E controls each driver of the substrate processing apparatus 1. The communicator 10F conducts communication with a controller for integrally controlling each component of the substrate processing system 100 and the like. The exhaust controller 10G controls the exhaust mechanism 38.

Further, a display unit 10H (e.g. a display and the like) for displaying various pieces of information and an input unit 10J (e.g. a keyboard, a mouse and the like) for receiving an input from an operator are connected to the control unit 10.

The arithmetic processor 10A is constituted by a computer including a CPU (=Central Processing Unit), a RAM (=Random Access Memory) and the like, and performs the bevel processing by controlling each component of the substrate processing apparatus 1 in accordance with the program stored in the storage 10B as described below. The bevel processing by the substrate processing apparatus 1 is described below with reference to FIGS. 15 and 16A to 16D.

Figure 15:
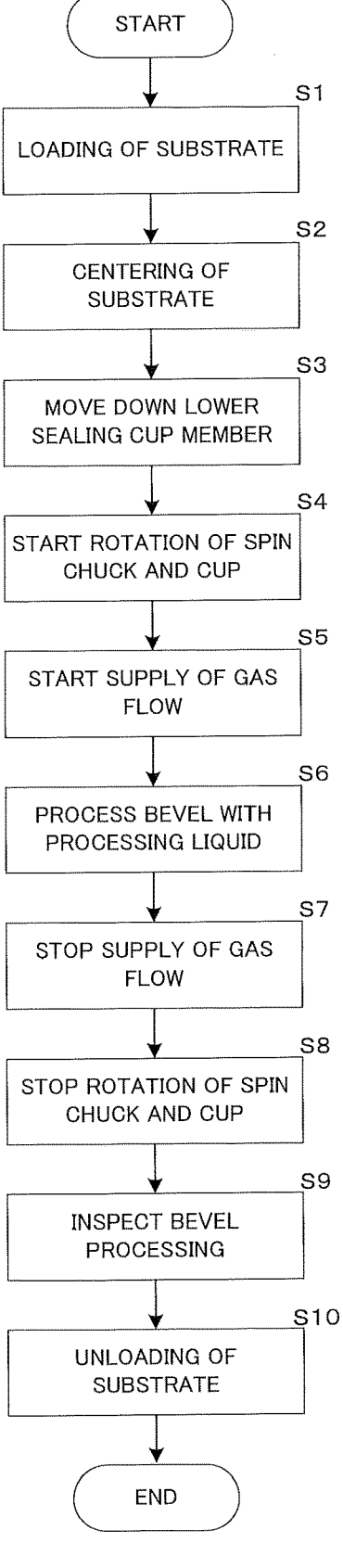
FIG. 15 is a flow chart showing the bevel processing performed as an example of a substrate processing operation by the substrate processing apparatus shown in FIG. 2.

FIG. 15 is a flow chart showing the bevel processing performed as an example of a substrate processing operation by the substrate processing apparatus shown in FIG. 2. FIGS. 16A to 16D are diagrams showing each apparatus component during the bevel processing. Note that a configuration to be integrally moved up is dotted for reference to be clearly shown in FIG. 16A, and a configuration to be integrally rotated is dotted for reference to be clearly shown in FIG. 16C.

Figure 16A:
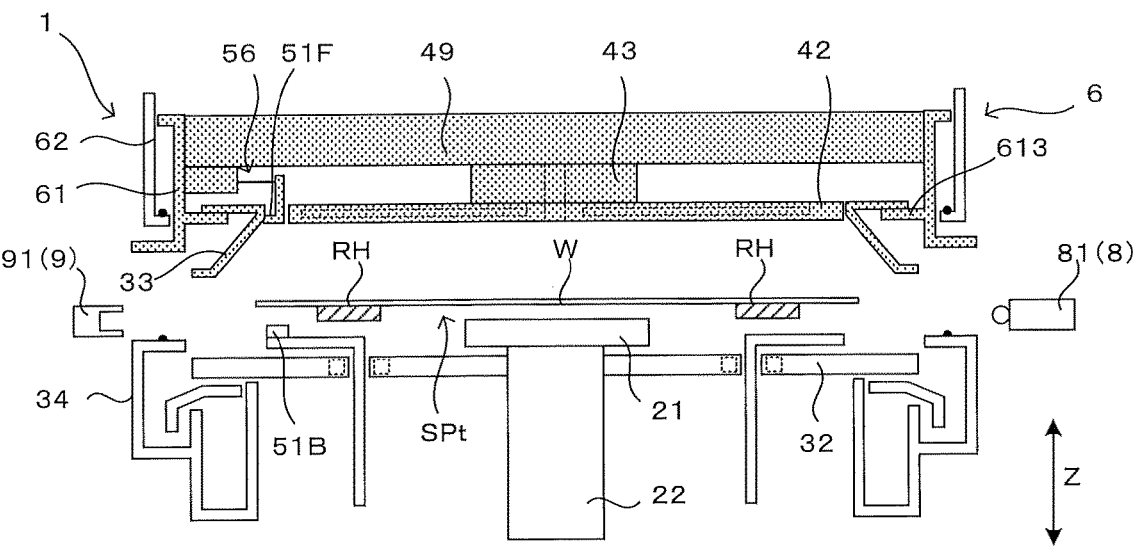
FIGS. 16A to 16D are diagrams showing each apparatus component during the bevel processing.

In applying the bevel processing to the substrate W by the substrate processing apparatus 1, the arithmetic processor 10A causes the elevation drivers 71, 72 to integrally move up the lower sealing cup member 61, the nozzle head 56, the beam member 49, the support member 43 and the disk part 42. While the lower sealing cup member 61 is moving up, the projections 613 are engaged with the upper annular part 332 of the upper cup 33 and, thereafter, the upper cup 33 is moved up together with the lower sealing cup member 61, the nozzle head 56, the beam member 49, the support member 43 and the disk part 42 and positioned at the retracted position. In this way, the conveyance space SPt sufficient to allow the entrance of the hand RH of the substrate conveyor robot 111 is formed above the spin chuck 21. If it is confirmed that the formation of the conveyance space SPt is completed, the arithmetic processor 10A gives a loading request of the substrate W to the substrate conveyor robot 111 via the communicator 10F and it is waited until an unprocessed substrate W is carried into the substrate processing apparatus 1 and placed on the upper surface of the spin chuck 21 as shown in FIG. 16A. Then, the substrate W is placed on the spin chuck 21 (Step S1). Note that, at this point of time, the pump 26 is stopped and the substrate W is horizontally movable on the upper surface of the spin chuck 21.

Figure 16B:
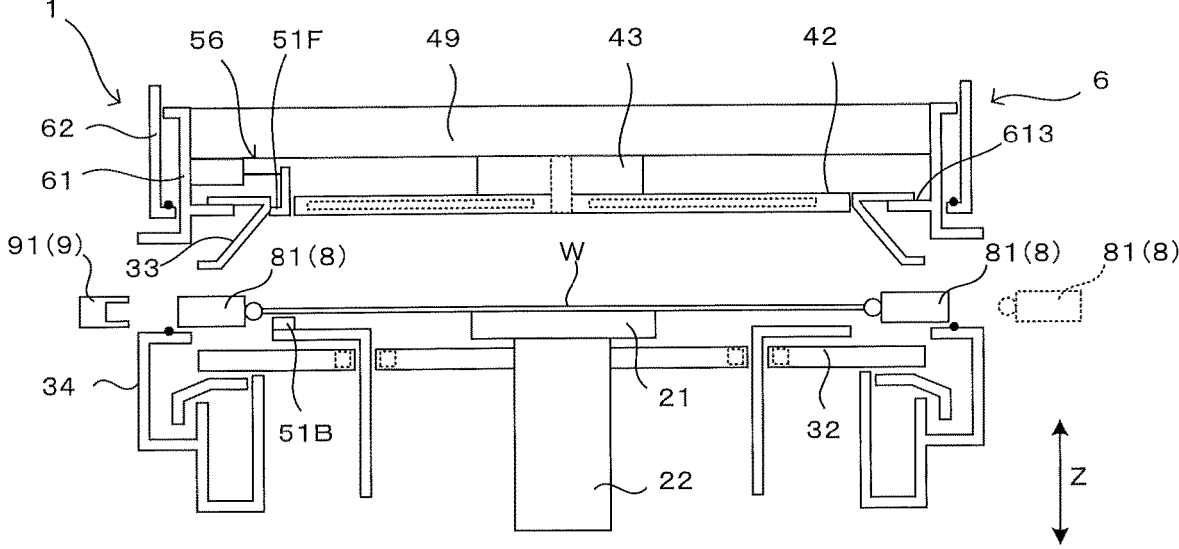

If the loading of the substrate W is completed, the substrate conveyor robot 111 is retracted from the substrate processing apparatus 1. Following that, the arithmetic processor 10A controls the centering driver 82 such that the three contact members 81 (only two are shown in FIG. 16B) approach the substrate W. In this way, the eccentricity of the substrate W with respect to the spin chuck 21 is eliminated and the center of the substrate W coincides with that of the spin chuck 21 (Step S2). If the centering processing is completed in this way, the arithmetic processor 10A controls the centering driver 82 to separate the three contact members 81 from the substrate W and operates the pump 26 to apply a negative pressure to the spin chuck 21. In this way, the spin chuck 21 sucks and holds the substrate W from below.

Subsequently, the arithmetic processor 10A gives a move-down command to the elevation drivers 71, 72. In response to this, the elevation drivers 71, 72 integrally move down the lower sealing cup member 61, the nozzle head 56, the beam member 49, the support member 43 and the disk part 42. During these downward movements, the upper cup 33 supported from below by the projections 613 of the lower sealing cup member 61 is coupled to the lower cup 32. That is, the recesses 335 are fit to cover the tip parts of the engaging pins 35 as shown in FIG. 6, the upper cup 33 is positioned in the horizontal direction with respect to the lower cup 32 and the upper and lower cups 33, 32 are bonded to each other to form the rotating cup 31 by attraction forces generated between the upper and lower magnets 37, 36.

After the rotating cup 31 is formed, the lower sealing cup member 61, the nozzle head 56, the beam member 49, the support member 43 and the disk part 42 are further integrally moved down, and the flange parts 611, 612 of the lower sealing cup member 61 are respectively locked by the flange part 621 of the upper sealing cup member 62 and the fixed cup 34. In this way, the lower sealing cup member 61 is positioned at the lower limit position (position in FIGS. 2 and 16C) (Step S3). After the above locking, the flange part 621 of the upper sealing cup member 62 and the flange part 611 of the lower sealing cup member 61 are held in close contact via the O-ring 63, and the flange part 612 of the lower sealing cup member 61 and the fixed cup 34 are held in close contact via the O-ring 63. As a result, as shown in FIG. 2, the lower sealing cup member 61 and the fixed cup 34 are connected in the vertical direction, and the sealed space SPs is formed by the upper sealing cup member 62, the lower sealing cup member 61 and the fixed cup 34, and the sealed space SPs is separated from the outside atmosphere (outside space SPo) (atmosphere separation).

In this atmosphere separated state, the lower surface of the disk part 42 covers the surface region excluding the peripheral edge part Ws, out of the upper surface Wf of the substrate W, from above. Further, the upper surface nozzles 51F are positioned in such a posture that the discharge ports 511 are facing the peripheral edge part of the upper surface Wf of the substrate W in the cut 44 of the disk part 42. If preparation for the supply of the processing liquids to the substrate W is completed in this way, the arithmetic processor 10A gives a rotation command to the rotation driver 23 to start the rotation of the spin chuck 21 holding the substrate W and the rotating cup 31 (Step S4). Rotating speeds of the substrate W and the rotating cup 31 are set, for example, at 1800 rpm. Further, the arithmetic processor 10A controls the drive of the heater driver 422 to heat the heater 421 to a desired temperature, e.g. 185° C.

Subsequently, the arithmetic processor 10A gives a nitrogen gas supply command to the nitrogen gas supplier 47. In this way, as shown by an arrow F1 of FIG. 16C, the supply of the nitrogen gas from the nitrogen gas supplier 47 to the center nozzle 45 is started (Step S5). This nitrogen gas is discharged from the center nozzle 45 toward the space SPa (FIG. 10) sandwiched between the substrate W and the disk part 42 after being heated to a desired temperature (e.g. 100° C.) by the ribbon heater 48 while passing in the pipe 46. In this way, the entire upper surface Wf of the substrate W is heated. Further, the substrate W is also heated by the heater 421. Thus, the temperature of the peripheral edge part Ws of the substrate W rises with the passage of time and reaches a temperature suitable for the bevel processing, e.g. 90° C. Further, the temperature of the substrate W other than the peripheral edge part Ws is also increased to a substantially equal temperature. That is, in this embodiment, the in-plane temperature of the upper surface Wf of the substrate W is substantially uniform. Therefore, the warping of the substrate W can be effectively suppressed.

Figure 16C:
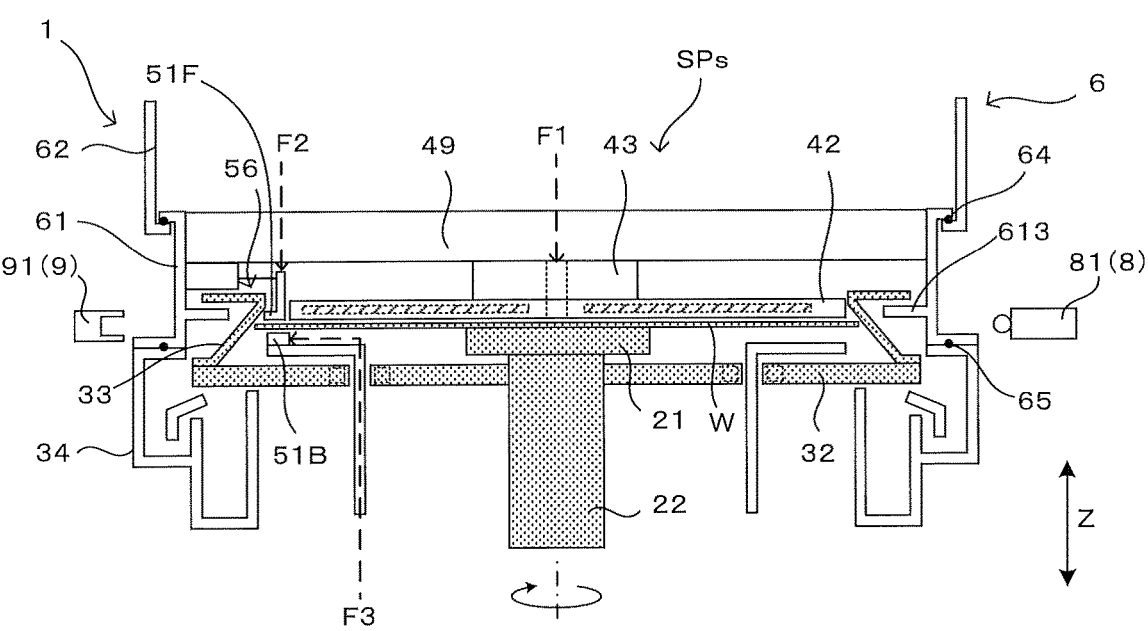

Following this, the arithmetic processor 10A supplies the processing liquids to the upper surface nozzles 51F and the lower surface nozzles 51B by controlling the processing liquid suppliers 52 (arrows F2, F3 in FIG. 16C). That is, flows of the processing liquids are discharged from the upper surface nozzles 51F to contact the peripheral edge part of the upper surface of the substrate W, and flows of the processing liquids are discharged from the lower surface nozzles 51B to contact the peripheral edge part of the lower surface of the substrate W. In this way, the bevel processing is performed on the peripheral edge part Ws of the substrate W (Step S6). Upon detecting the passage of a processing time required for the bevel processing of the substrate W, the arithmetic processor 10A gives a supply stop command to the processing liquid suppliers 52 to stop the discharge of the processing liquids.

Following that, the arithmetic processor 10A gives a supply stop command to the nitrogen gas supplier 47 to stop the supply of the nitrogen gas from the nitrogen gas supplier 47 to the center nozzle 45 (Step S7). Further, the arithmetic processor 10A gives a rotation stop command to the rotation driver 23 to stop the rotation of the spin chuck 21 and the rotating cup 31 (Step S8).

In next Step S9, the arithmetic processor 10A observes the peripheral edge part Ws of the substrate W to inspect a result of the bevel processing. More specifically, the arithmetic processor 10A positions the upper cup 33 at the retracted position to form the conveyance space SPt in a manner similar to that during the loading of the substrate W. Then, the arithmetic processor 10A controls the observation head driver 92 to bring the observation head 91 closer to the substrate W. If the peripheral edge part Ws is imaged by the observation head 91, the arithmetic processor 10A controls the observation head driver 92 to retract the observation head 91 from the substrate W. In parallel with this, the arithmetic processor 10A inspects based on the captured image of the peripheral edge part Ws whether or not the bevel processing has been satisfactorily performed.

After the inspection, the arithmetic processor 10A gives an unloading request of the substrate W to the substrate conveyor robot 111 via the communicator 10F, and the processed substrate W is carried out from the substrate processing apparatus 1 (Step S10). Note that this series of steps is repeatedly performed.

As described above, in this embodiment, the atmosphere separating mechanism 6 is provided above the scattering preventing mechanism 3 to conduct the so-called atmosphere separation of separating the sealed space SPs for performing the bevel processing by the processing liquids and the outside space SPo. In this way, a range to be processed by the processing liquids is limited, turbulence generation positions can be reduced, and the bevel processing can be stably performed. Further, components having no chemical resistance can be adopted in the outside space SPo although being in the chamber 11. To obtain such effects, the atmosphere separating mechanism 6 is composed of the upper sealing cup member 62 fixed near the ceiling wall 11a and the lower sealing cup member 61 movable up and down between the upper sealing cup member 62 and the scattering preventing mechanism 3. Therefore, the following effects are also obtained.

Figure 16D:
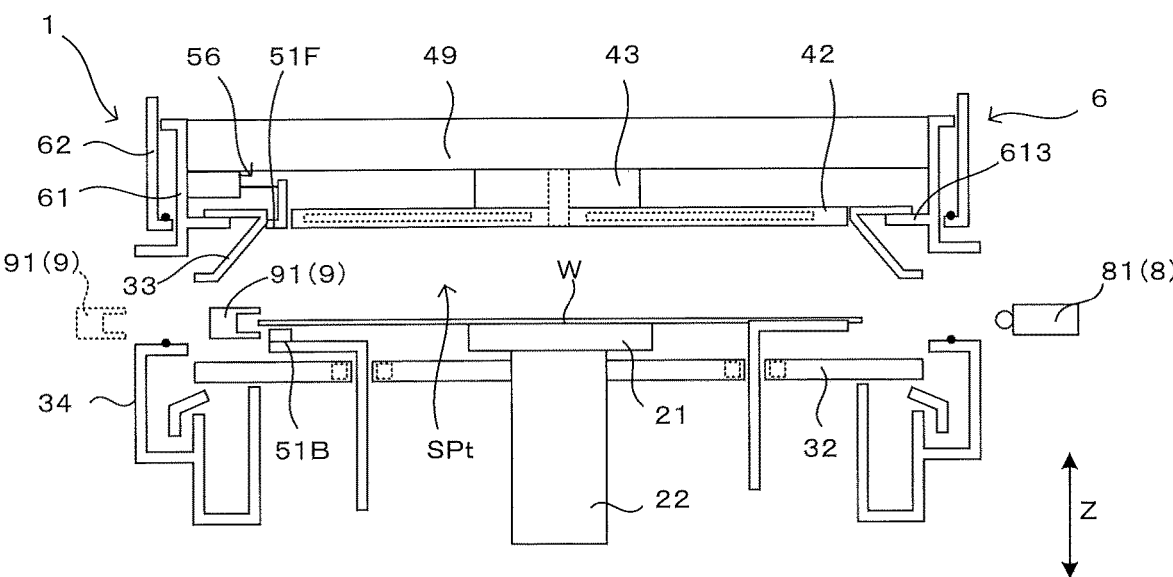

To conduct the atmosphere separation, a technique has been conventionally proposed which brings a cup member constituting a scattering preventing mechanism into contact with a ceiling of a chamber (e.g. JP 6282904B). In this conventional technique, the entire cup member needs to be moved down in carrying in and out the substrate W. In contrast, in this embodiment, it is sufficient to move up the lower sealing cup member 61 by a minimum distance necessary for the carry-in and -out processing of the substrate W, and a movement amount of the lower sealing cup member 61 can be suppressed. This point can be dealt with by moving up the lower sealing cup member 61 also when the centering processing shown in FIG. 16B is performed and when the observation processing shown in FIG. 16D is performed. From these, a tact time of the substrate processing apparatus 1 can be made shorter than that of the conventional apparatus (effect A).

Further, in the above embodiment, a load applied to the elevating mechanism can be made smaller than that of the conventional apparatus for moving up and down the entire cup member since only the lower sealing cup member 61 is moved up and down. Further, as shown in FIG. 3, the lower sealing cup member 61 is moved up and down while being supported at three positions mutually different in the circumferential direction. Therefore, the lower sealing cup member 61 can be stably moved up and down. Further, the upper cup 33, the upper surface protecting/heating mecha-
nism 4 and the nozzle head 56 are moved up and down via
the lower sealing cup member 61, and these can also be
stably moved up and down at low cost (effect B).

Further, in this embodiment, as shown in FIG. 2, the clean
air sent from the fan filter unit 13 is separated to the clean
air to be sent to the sealed space SPs and that to be sent to
the outside space SPo by bringing the upper opening of the
upper sealing cup member 62 closer to the punching plate 14
provided right below the ceiling wall 11*a*. In this way, an air
volume of the clean air to be sent to each space is controlled.
Therefore, the sealed space SPs can be set to have a desired
pressure value and a pressure difference between the sealed
space SPs and the outside space SPo can be adjusted with
high accuracy. Moreover, a volume of the sealed space SPs
functioning as a processing liquid atmosphere area can be
reduced, and the use of the utilities of the factory in which
the substrate processing apparatus 1 is installed can be
reduced (effect C).

Figure 17A:
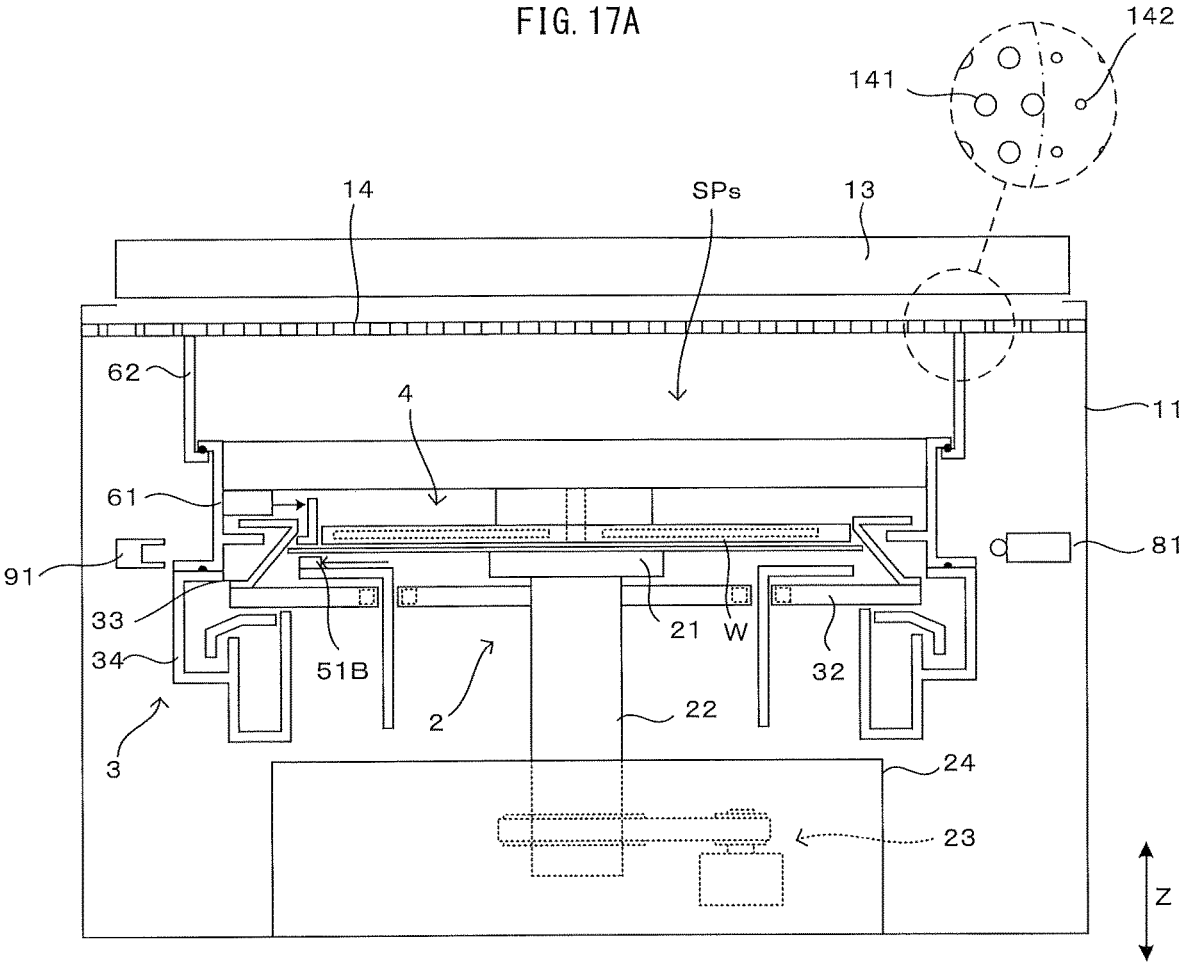
FIG. 17A is a diagram showing the first modification of the first embodiment of the substrate processing apparatus according to the invention.
Figure 17B:
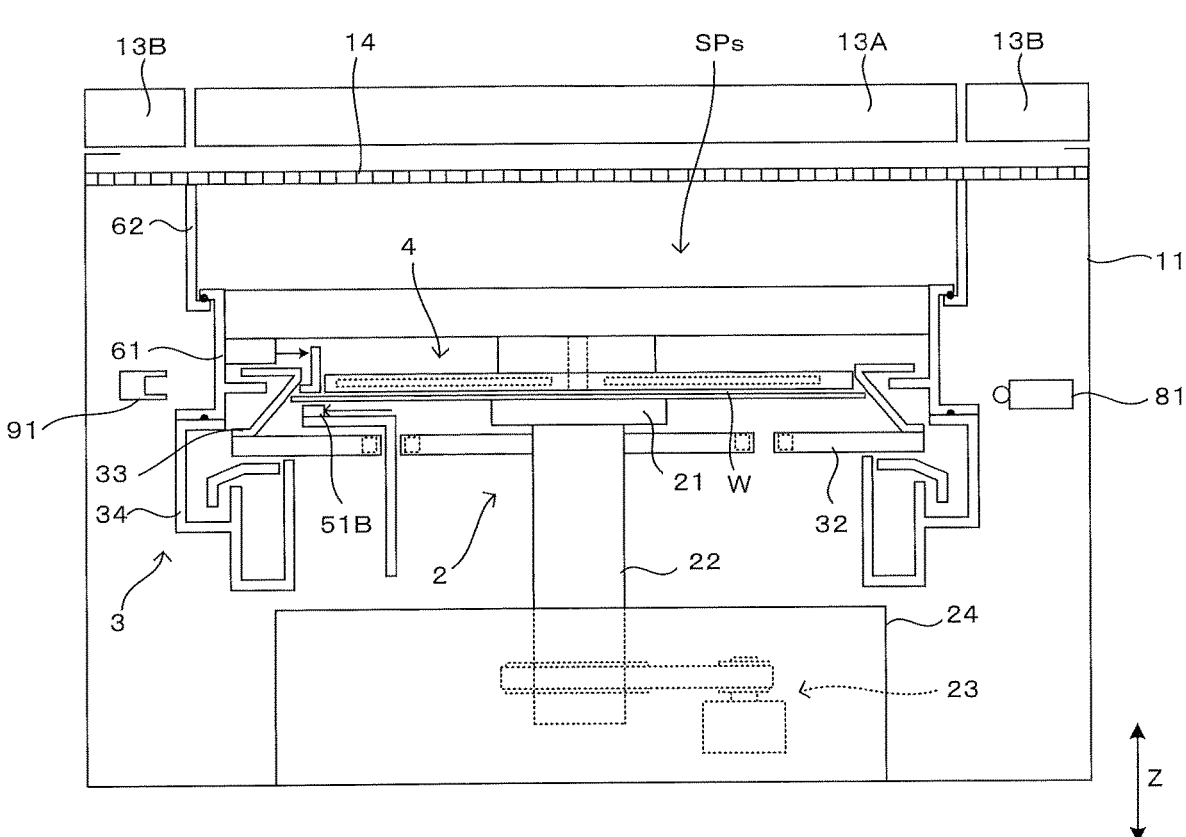
FIG. 17B is a diagram showing the second modification of the first embodiment of the substrate processing apparatus according to the invention.
Figure 17C:
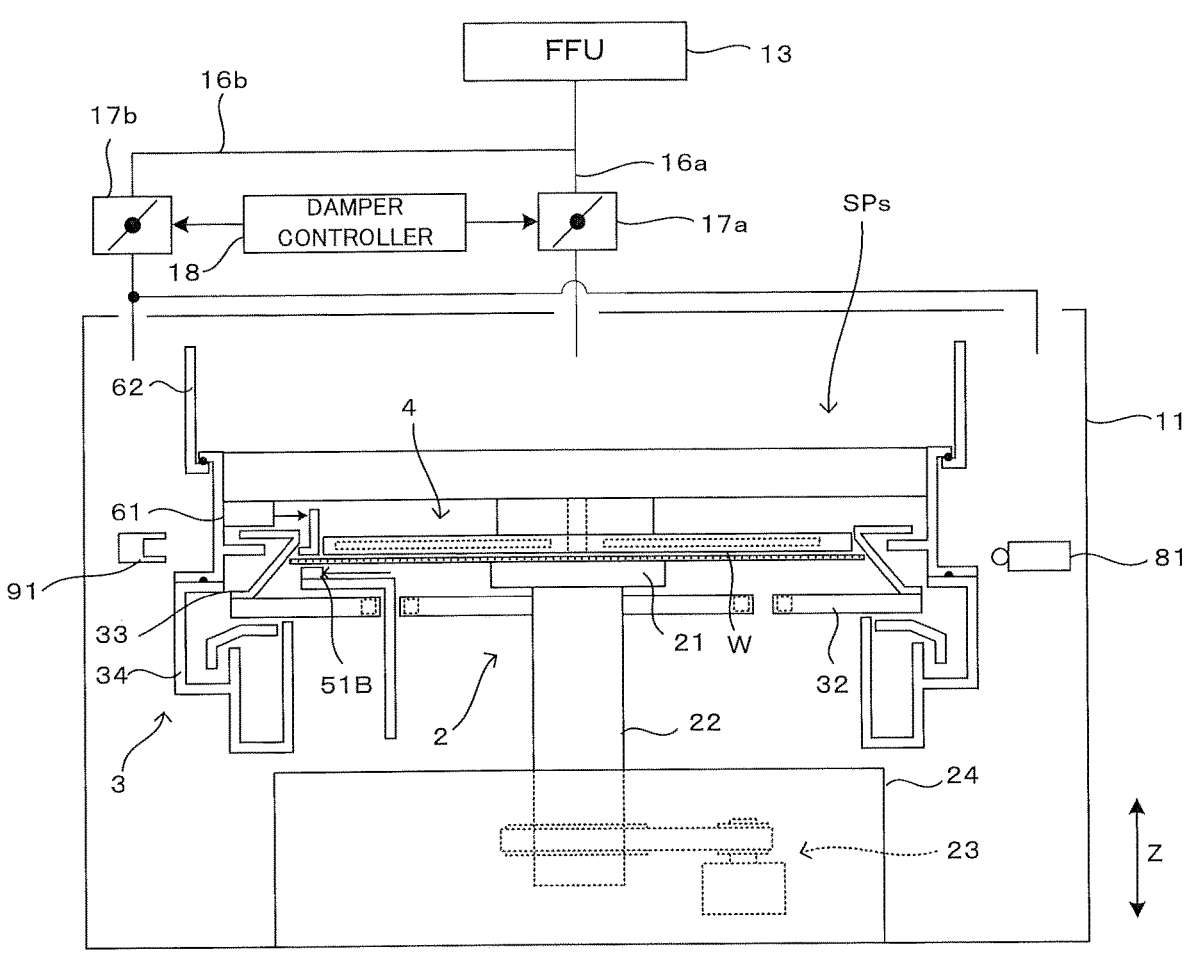
FIG. 17C is a diagram showing the third modification of the first embodiment of the substrate processing apparatus according to the invention.

Here, various methods can be adopted for the air volume
control of the clean air. For example, as shown in FIG. 17A,
the air volume into the sealed space SPs may be controlled
to be more than that into the outside space SPo by making
an inner diameter of air outlets 141 facing the upper opening
of the upper sealing cup member 62 than those of other air
outlets 142. To enhance the pressure accuracy of the sealed
space SPs and the outside space SPo, a fan filter unit 13A for
the sealed space SPs and a fan filter unit 13B for the outside
space SP0 may be individually provided, for example, as
shown in FIG. 17B. Further, as shown in FIG. 17C, the clean
air blown from the fan filter unit 13 may be supplied into the
sealed space SPs via a first pipe 16*a* and supplied into the
outside space SPo via a second pipe 16*b* instead of the
punching plate 14. Dampers 17*a*, 17*b* may be respectively
disposed in the first and second pipes 16*a*, 16*b*, and a damper
controller 18 may individually control an opening of each
damper 17*a*, 17*b* in response to an opening command from
the control unit 10, thereby controlling the pressure by
adjusting supply amounts into the sealed space SPs and the
outside space thereof.

Figure 18:
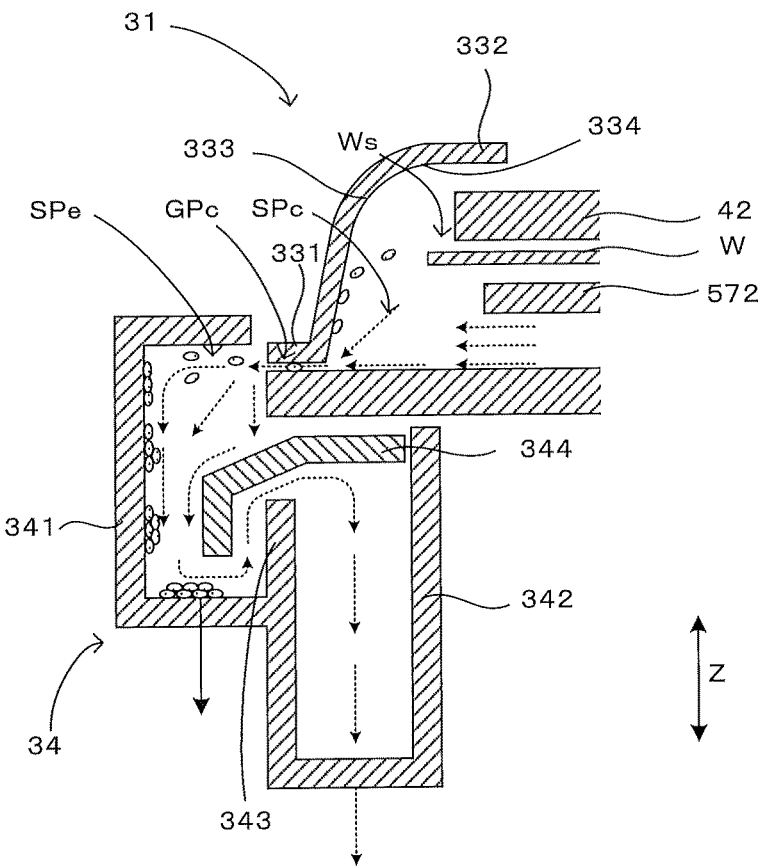
FIG. 18 is a diagram showing the fourth modification of the first embodiment of the substrate processing apparatus according to the invention.

Further, in the above embodiment, the liquid droplets
scattered from the substrate W are collected inside the
rotating cup 31, i.e. in the collection space SPc as shown in
FIG. 8. At this time, a centrifugal force generated according
to cup rotation acts on the liquid droplets adhering to the
inclined surface 334 of the rotating cup 31. Further, the
liquid droplets are affected by a gas flow formed by the
nitrogen gas or the like supplied during the bevel processing
and flowing radially outward along the upper and lower
surfaces of the substrate W. By these, a load of a downward
vector along the inclined surface 334 acts on the liquid
droplets. The liquid droplets having received this stress are
moved to the gap GPc between the upper and lower cups 33,
32 along the inclined surface 334. The liquid droplets having
reached the entrance of the gap GPc are moved to the
discharge space SPe of the fixed cup 34 via the gap GPc
together with the gas components such as the nitrogen gas.
Thus, the liquid droplets adhering to the rotating cup 31 are
quickly discharged from the rotating cup 31 by way of the
gap GPc. Particularly, since the gap GPc is parallel to a
direction of the centrifugal force and the gas flow, the liquid
droplets can be smoothly discharged from the collection
space SPc into the discharge space SPe. Thus, the collision
of the liquid droplets scattered from the substrate W and
those adhering to the rotating cup 31 can be reduced and the
generation of the bouncing liquid droplets can be sup-
pressed. As a result, the bevel processing can be satisfactorily performed (effect D). Note that although the inclined
surface 334 of the upper cup 33 is finished into a truncated
conical surface having a constant angle of inclination in a
vertical cross-section in this embodiment, the inclined sur-
face 334 may be finished into a surface bulging radially
outward (leftward of FIG. 18), for example, as shown in
FIG. 18.

Further, in this embodiment, the upper cup 33 is coupled
to the lower cup 32 by the engagement of the engaging pins
35 with the recesses 335 and attraction forces generated
between the upper and lower magnets 37, 36 as shown in
FIG. 6. Accordingly, the upper and lower cups 33, 32 are
firmly coupled also during rotation, and the bevel processing
can be stably performed (effect E). Of course, the coupling
of the upper and lower cups 33, 32 is not limited to this. For
example, the upper and lower cups 33, 32 may be coupled
only by the engagement.

Further, in this embodiment, a part of a rotational driving
force output from the rotation driver 23 to rotate the sub-
strate W is given as a cup driving force to the lower cup 32
via the power transmitter 27. In this way, both the substrate
W and the rotating cup 31 can be driven by the single
rotation driver 23, and the apparatus configuration can be
simplified. Further, the substrate W and the rotating cup 31
can be synchronously rotated in the same direction. Thus, if
the rotating cup 31 is viewed from the peripheral edge part
of the rotating substrate W, the rotating cup 31 is relatively
stationary. Therefore, the bounce of the liquid droplets
caused when the liquid droplets of the processing liquid
scattered from the substrate W collide with the rotating cup
31 can be further satisfactorily suppressed (effect F).

This power transmitter 27 uses the action of magnetic
forces between the magnets 27*b* and 27*c*. Thus, as shown in
FIGS. 4 and 5, the cup driving force can be transmitted to the
lower cup 32 while the air gap GPa (gap between the annular
member 27*a* and the lower cup 32) is maintained between
the annular member 27*a* and the lower cup 32. Then, as
shown in FIG. 2, the flange part 572 of the nozzle support
57 is loosely inserted into this air gap GPa, and the nozzle
support 57 is fixedly arranged. Further, the air gap GPa is
also used as a piping route. That is, pipes connected to the
lower surface nozzles 51B supported on the nozzle support
57 are connected to the processing liquid supplier 52 by way
of the air gap GPa. Therefore, the pipe lengths are consid-
erably shortened, and a degree of freedom and tolerances of
the layout of the respective components of the substrate
processing apparatus 1 can be enhanced (effect G).

Further, in this embodiment, the inclined part 333 of the
upper cup 33 extends above the peripheral edge part Ws of
the substrate W as shown in FIGS. 7 and 8. That is, parts of
the upper annular part 332 and the inclined part 333 function
as an eaves part for covering the peripheral edge part Ws of
the substrate W held on the spin chuck 21 over the entire
circumference in a plan view vertically from above. Further,
in this embodiment, the upper surface nozzle 51F discharges
the processing liquid from the discharge port 511 thereof and
causes the processing liquid to land on the peripheral edge
part Ws of the substrate W with the discharge port 511
located at the bevel processing position lower than the eaves
part in the vertical direction as shown in FIG. 12(*a*). There-
fore, the following effect is obtained.

When being collected by the rotating cup 31, the liquid
droplets may collide with the inclined surface 334 of the
upper cup 33 and some of them may fly upward. Further,
when the processing liquid is supplied to the peripheral edge
part of the substrate W, some of the liquid droplets of the
processing liquid may be scattered upward. If the liquid droplets scattered upward adhere to the substrate W again, watermarks are produced. However, in this embodiment, the above eaves part effectively prevents re-adhesion to the substrate W by collecting the liquid droplets scattered upward. Therefore, the substrate W can be more satisfactorily beveled. Further, a similar effect is obtained also in the pre-dispense processing shown in FIG. 12(b) (effect H).

This pre-dispense processing can be performed by moving the upper surface nozzles 51F by a very short distance in the radial direction X of the substrate W by the nozzle mover 55. Accordingly, the upper surface nozzles 51F need not be moved to a position distant from the rotating cup 31 for the pre-dispense processing, and the pre-dispense processing can be performed in the rotating cup 31. As a result, a tact time of the substrate processing apparatus 1 can be made shorter than that of the conventional apparatus (effect I).

Figure 19:
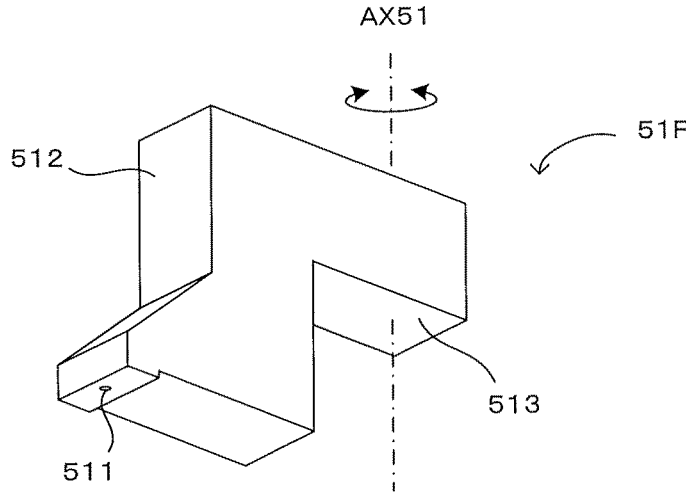
FIG. 19 is a diagram showing the fifth modification of the first embodiment of the substrate processing apparatus according to the invention.

Here, a moving direction of the upper surface nozzle 51F in performing the pre-dispense processing is not limited to the radial direction X, but arbitrary. For example, as shown in FIG. 19, an pivot axis AX51 is provided in one end part 513 distant from the discharge port 511, out of a nozzle body 512 constituting the upper surface nozzle 51F. This pivot axis AX51 extends in parallel to the vertical direction Z. Thus, a landing position of the processing liquid discharged from the discharge port 511 can be changed by the nozzle mover 55 moving the upper surface nozzle 51F about the pivot axis AX51. More specifically, the bevel processing position and the pre-dispense position may be switched by rotating the upper surface nozzle 51F about the pivot axis AX51.

Further, in this embodiment, the nozzle mover 55 can not only switch the bevel processing position and the pre-dispense position, but also change the landing position of the processing liquid by changing the position of the discharge port 511 in the radial direction X of the substrate W. That is, the processing liquid can be landed on a desired position of the peripheral edge part Ws by the arithmetic processor 10A controlling the nozzle mover 55. Thus, a width (length from the end surface of the substrate W to the liquid landing position in the radial direction X) of the bevel processing can be changed in the peripheral edge part Ws of the substrate W. Note that such a function is similarly achieved also in the embodiment shown in FIG. 19.

Further, in this embodiment, the disk part 42 is provided to cover the upper surface Wf of the substrate W from above. Accordingly, as shown in FIG. 9, the disk part 42 is provided with the cut 44, and the upper surface nozzles 51F are movable over a relatively wide range, and the function of switching between the bevel processing position and the pre-dispense position and the mechanism for changing the bevel processing width can be effectively achieved (effect J).

Here, the cut 44 is one of main causes to generate a turbulence in the sealed space SPs. However, in this embodiment, the lower end parts of the upper surface nozzles 51F enter the cut 44 to partially close the cut 44 as shown in FIGS. 3, 9 and 12. In this way, the generation of a turbulence in the cut 44 can be suppressed (effect K).

Figure 20A:
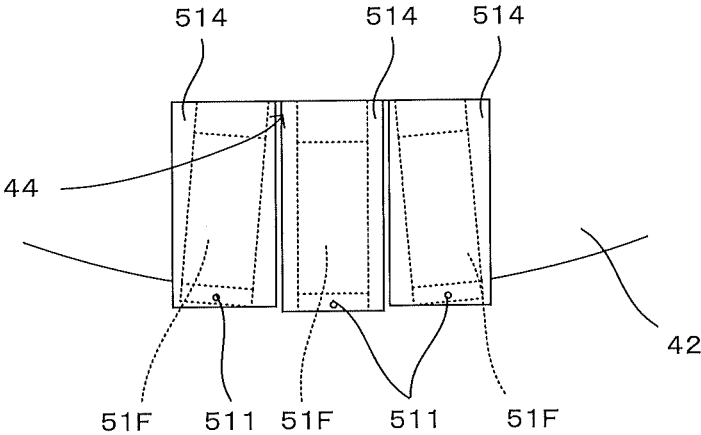
FIG. 20A is a diagram showing the sixth modification of the first embodiment of the substrate processing apparatus according to the invention.
Figure 20B:
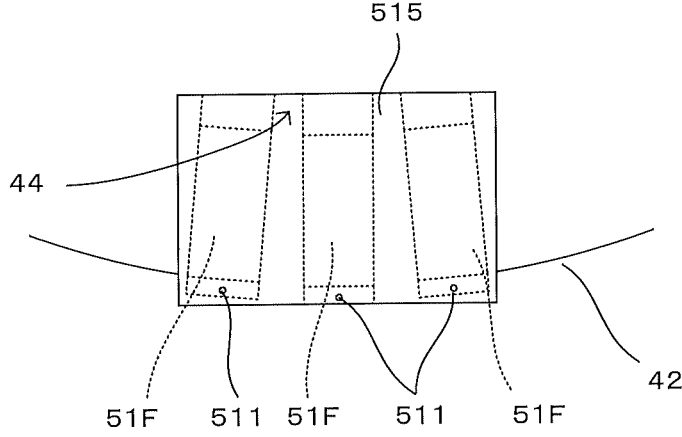
FIG. 20B is a diagram showing the seventh modification of the first embodiment of the substrate processing apparatus according to the invention.

Further, to effectively suppress the generation of a turbulence, attachments 514 may be attached to the respective upper surface nozzles 51F while the positions of the discharge ports 511 and the postures of the upper surface nozzles 51F are maintained as shown in FIG. 20A. Further, as shown in FIG. 20B, a single attachment 515 may be attached to all the upper surface nozzles 51F while the positions of the discharge ports 511 and the postures of the upper surface nozzles 51F are maintained. By these arrangements, an occupancy ratio of the respective upper surface nozzles 51F with attachment(s) in the cut 44 increases and the cut 44 can be substantially closed. As a result, the generation of a turbulence in the cut 44 can be more effectively suppressed.

Further, in this embodiment, the upper surface protecting/heating mechanism 4 is provided to make the in-plane temperature of the substrate W uniform. More specifically, the flow rate and temperature of the heating gas to be supplied to the center nozzle 45 are controlled based on a simulation result to be described next.

As shown in FIG. 10, an airflow analysis was performed for cases where a nitrogen gas (heating gas) was discharged at various flow rates from the center nozzle 45 toward the substrate W rotating with the disk part 42 held in proximity to the substrate W held on the spin chuck 21 in the vertical direction. Here, the heater 421 and the ribbon heater 48 were stopped and specific analysis conditions were set as follows.

Separation distance between substrate W and disk part 42=2 mm
Rotating speed of substrate W=1800 rpm
Discharge flow rate of nitrogen gas=0, 50, 75, 100, 130 L/min
Aperture of center nozzle 45=60 mmφ

Figure 21:
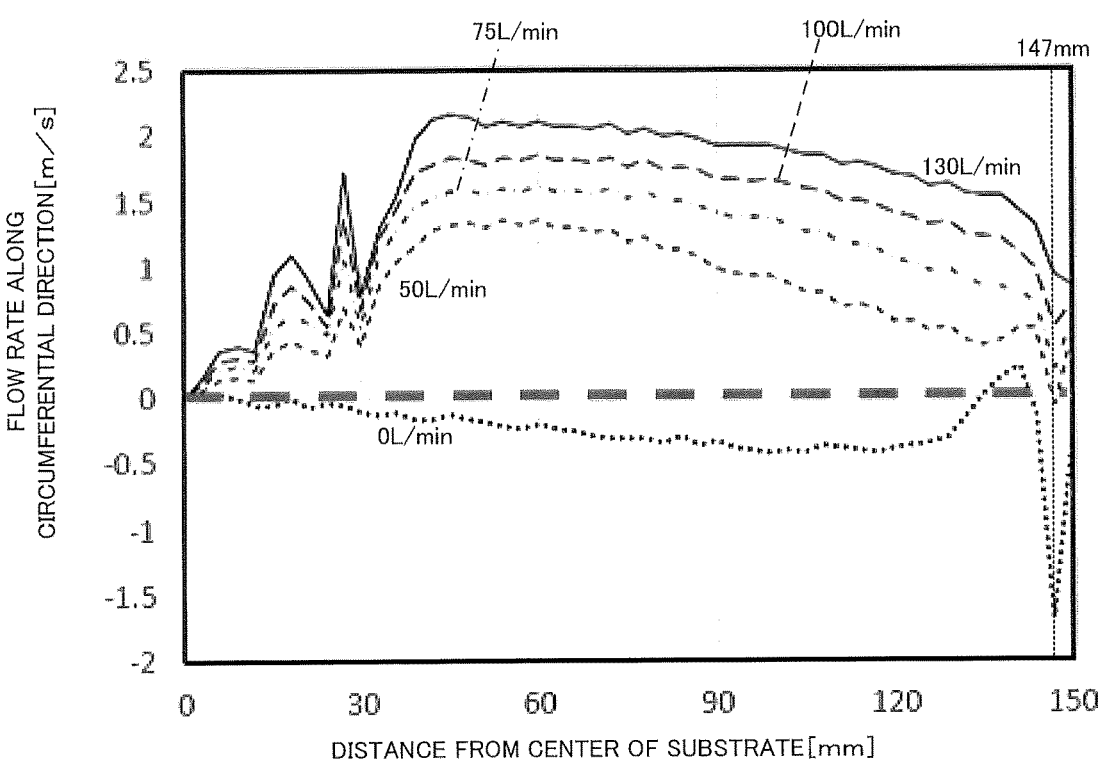
FIG. 21 is a graph showing the air velocity at each position in the substrate radial direction with respect to the discharge flow rate of nitrogen gas.
Figure 22:
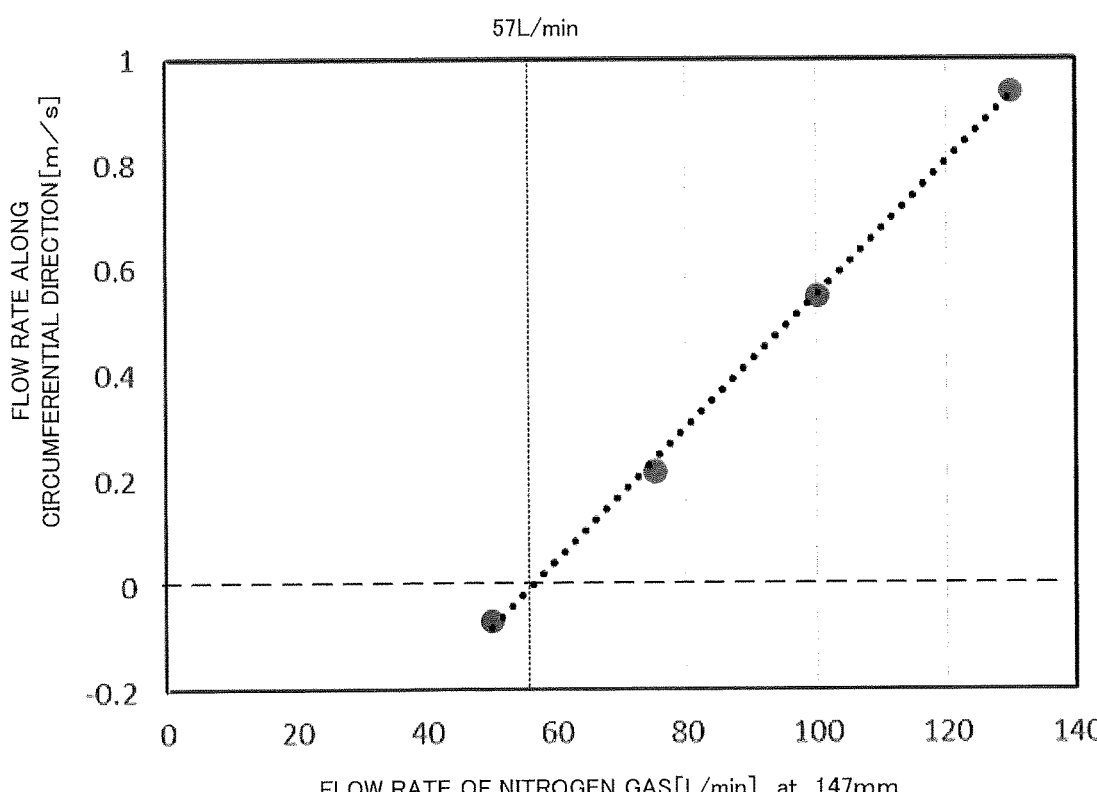
FIG. 22 is a graph showing the air velocity in the radial direction of the substrate with respect to the discharge flow rate of the nitrogen gas at the peripheral portion of the substrate.

A graph plotting air flow velocities at respective positions in the radial direction X of the substrate W under these analysis conditions is shown in FIG. 21. As is understood from FIG. 21, the air flow velocity in the radial direction X of the substrate W changes according to the flow rate of the nitrogen gas discharged from the center nozzle 45. Particularly, if the air flow velocity at the peripheral edge part Ws (here, 147 mm from the substrate center) of the substrate W falls below zero, i.e. if an airflow from the periphery (collection space SPc) of the substrate W toward the substrate center is generated, liquid droplets are entrained. Accordingly, the air flow velocity at the peripheral edge part Ws (here, 147 mm from the substrate center) of the substrate W is read for each gas flow rate and a graph plotting the air flow velocities is shown in FIG. 22. As is understood from FIG. 22, the nitrogen gas needs to be discharged at about 57 L/min or higher from the center nozzle 45 to prevent the entrainment of the liquid droplets.

On the other hand, the air flow velocity increases as the flow rate of the nitrogen gas discharged from the center nozzle 45 increases. Accordingly, if the nitrogen gas is supplied at an excessive flow rate from the center nozzle 45, the air flow velocity along the upper surface Wf of the substrate W increases and a pattern formed on the upper surface Wf of the substrate W may be adversely affected. Further, in this embodiment, the liquid droplets and the gas components collected in the collection space SPc are discharged into the discharge space SPe via the gap GPc as shown in FIG. 8. Thus, if the flow rate of the nitrogen gas flowing into the collection space SPc from the substrate W becomes excessive beyond an exhaust flow rate from discharge space SPe by the exhaust mechanism 38, a backflow swirl may be generated. If the flow rate of the nitrogen gas is increased, an exhaust air velocity between the substrate W and the rotating cup 31 decreases. This is found from the airflow analysis. One of main causes of this is that the gap GPc is narrow and, if the flow rate of the nitrogen gas is increased, a pressure loss is caused and an exhaust, which cannot be discharged, may form a backflow to generate a swirl of the backflow also on an end part of the upper surface of the substrate W. Accordingly, it is desirable to set a maximum value of the flow rate of the nitrogen gas discharged from the center nozzle 45 within such a range that these are not generated, and the maximum value is set at about 0.3-fold of the above exhaust flow rate.

Next, the temperature of the heating gas is described. An airflow analysis was performed for cases where the heating gas was discharged at various temperatures from the center nozzle 45 toward the substrate W rotating with the disk part 42 including the built-in heater held in proximity to the substrate W held on the spin chuck 21 in the vertical direction. Here, specific analysis conditions were set as follows.

Temperature of heater 421=185° C.

Temperature of heating gas=27° C., 80° C., 130° C.

Separation distance between substrate W and disk part 42=2 mm

Rotating speed of substrate W=1800 rpm

Discharge flow rate of heating gas=80 L/min

Aperture of center nozzle 45=60 mm$\phi$

Figure 23:
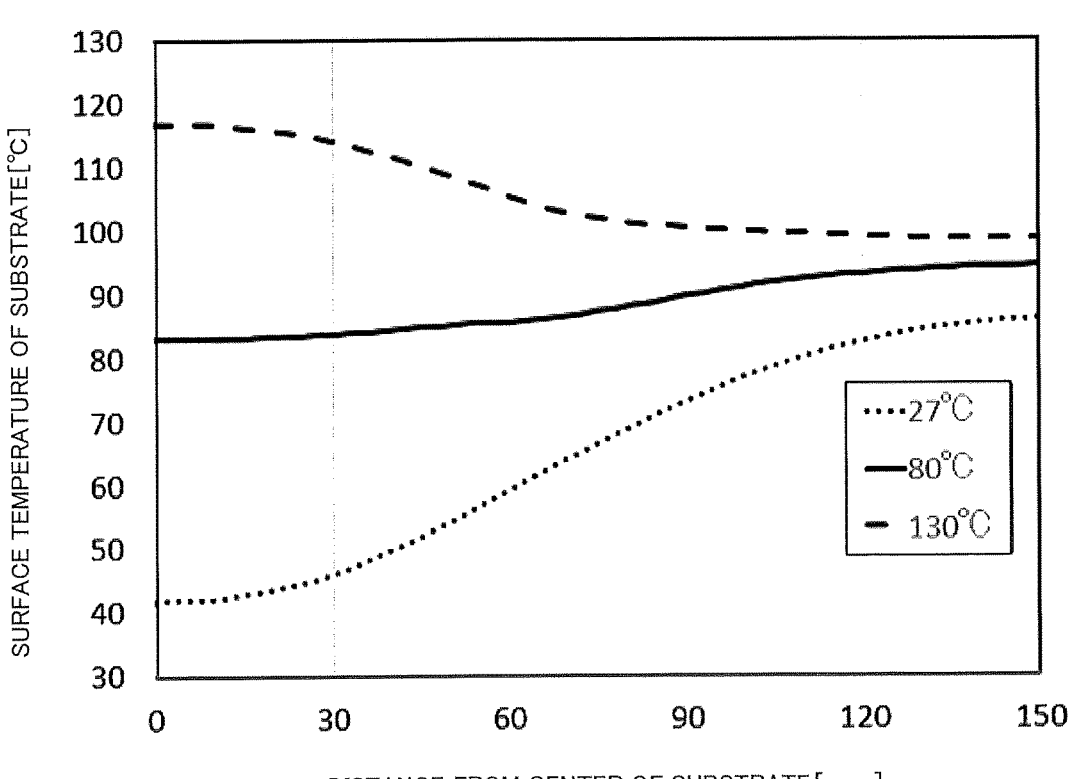
FIG. 23 is a graph showing changes in surface temperature at each position in the radial direction of the substrate with respect to the temperature of the heating gas.
Figure 24:
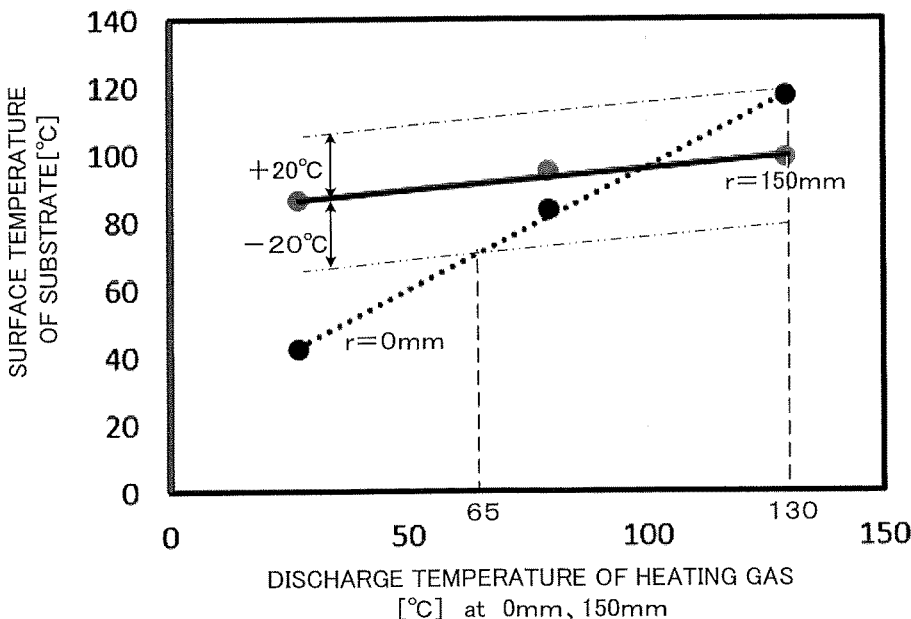
FIG. 24 is a graph showing changes in surface temperature with respect to the temperature of the heated gas at the center and edge of the substrate.

A graph plotting surface temperatures of the substrate W at respective positions in the radial direction X of the substrate W under these analysis conditions is shown in FIG. 23. As is understood from FIG. 23, the uniformity of the in-plane temperature in the substrate W tends to be improved and show a peak as the temperature of the heating gas increases and be slightly reduced by a further temperature increase. Accordingly, graphs plotting surface temperature changes of the substrate W according to a change in the discharge temperature of the heating gas at a center position (r=0 mm) and an edge position (r=150 mm) of the substrate W are shown in FIG. 24. As is understood from these graphs, the surface temperature of the substrate W can be made uniform by setting the temperature of the heating gas discharged from the center nozzle 45 at about 100° C. Further, a surface temperature difference is desirably suppressed within a range of 20° C. or less to satisfactorily perform the bevel processing while suppressing the warping of the substrate W. From this point, in this embodiment, an upper limit value of the discharge temperature of the heating gas is set at 130° C. from a chain line 1 (+20° C.) and a dotted line (r=0 mm) in FIG. 24, and a lower limit value of the discharge temperature of the heating gas is set at 65° C. from a chain line 2 (−20° C.) and the dotted line (r=0 mm). That is, the arithmetic processor 10A sets the temperature of the heating gas in a discharge temperature range of 65° C. to 130° C.

Figure 25:
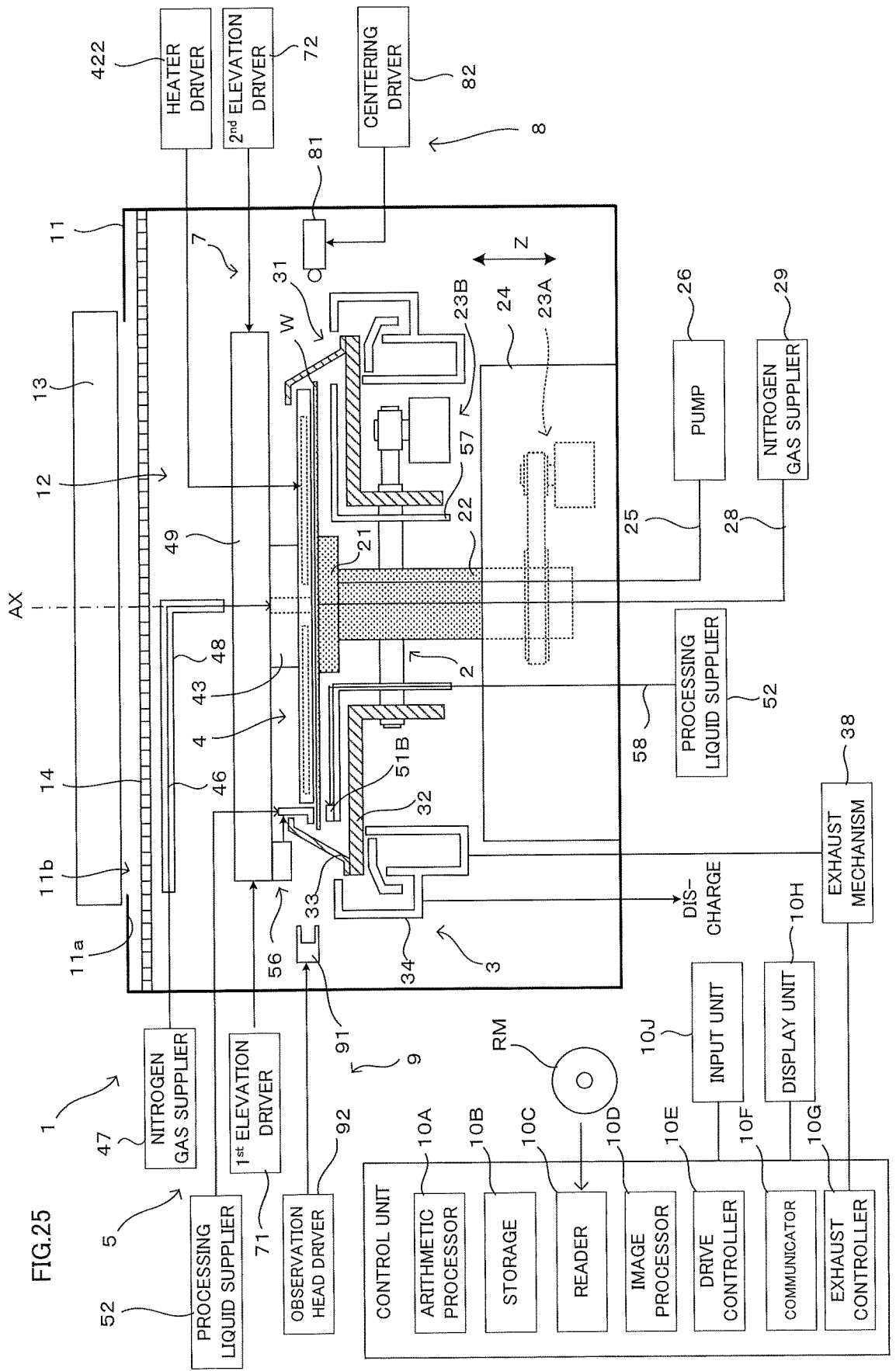
FIG. 25 is a diagram showing the configuration of a second embodiment of the substrate processing apparatus according to the invention.
Figure 26:
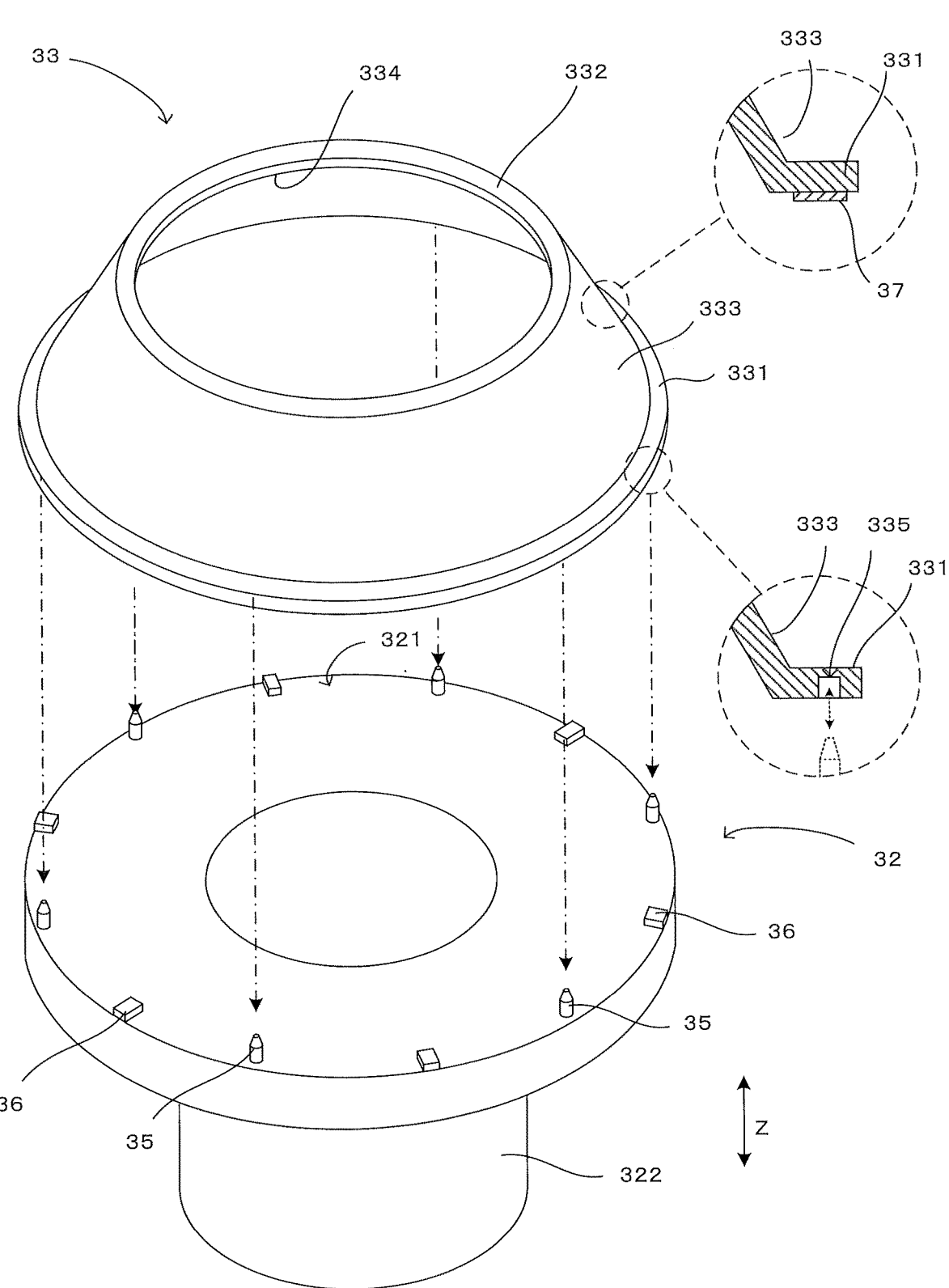
FIG. 26 is a diagram showing the configuration of a rotating cup in the second embodiment.

FIG. 25 is a diagram showing the configuration of a second embodiment of the substrate processing apparatus according to the invention. FIG. 26 is a diagram showing the configuration of a rotating cup in the second embodiment. This second embodiment is largely different from the first embodiment in:

(A) The atmosphere separating mechanism 6 is not provided, and (B) Rotation drivers 23A, 23B for respectively rotationally driving a spin chuck 21 and the rotating cup 31 are provided.

According to the point of difference (A), a nozzle head 56 is fixed to a beam member 49. Further, a first elevation driver 71 is coupled to one end part of the beam member 49, and a second elevation driver 72 is coupled to the other end part of the beam member 49. Thus, the nozzle head 56, the beam member 49, a support member 43 and a disk part 42 are integrally moved up and down by an arithmetic processor 10A synchronously controlling the first and second elevation drivers 71, 72. Further, an upper annular part 332 of an upper cup 33 extends radially inward with respect to an upper end part of an inclined part 333 such that the lower surface thereof is engageable with a peripheral edge part of the upper surface of the disk part 42 moving up and down as described above. Thus, the upper cup 33 is positioned at a position where the upper cup 33 is coupled to a lower cup 32 (FIG. 25 and FIG. 28C to be described later) and a position where the upper cup 33 is separated upward from the lower cup 32 (FIGS. 28A, 28B and 28C to be described later) according to upward and downward movements of the disk part 42.

Further, according to the point of difference (B), a tubular part 322 is attached to the lower surface of the lower cup 32. This tubular part 322 is coupled to the rotation driver 23B via a belt member. Thus, if the arithmetic processor 10A gives a rotation command to the rotation driver 23B, the rotation driver 23B operates to rotate the lower cup 32 about an axis of rotation AX in response to this command. Note that the rotation driver 23A is the same as that of the first embodiment and rotates the spin chuck 21 about the axis of rotation AX in response to a rotation command from the arithmetic processor 10A. As just described, in the second embodiment, a substrate W and the rotating cup 31 can be driven independently of each other by so-called two-axis driving. However, in performing a bevel processing, the arithmetic processor 10A synchronously rotates both the rotating cup 31 and the substrate W in the same direction as in the first embodiment by synchronously controlling the rotation drivers 23A, 23B.

Note that the other components are basically the same as those of the first embodiment, denoted by the same reference signs and not described.

Figure 27:
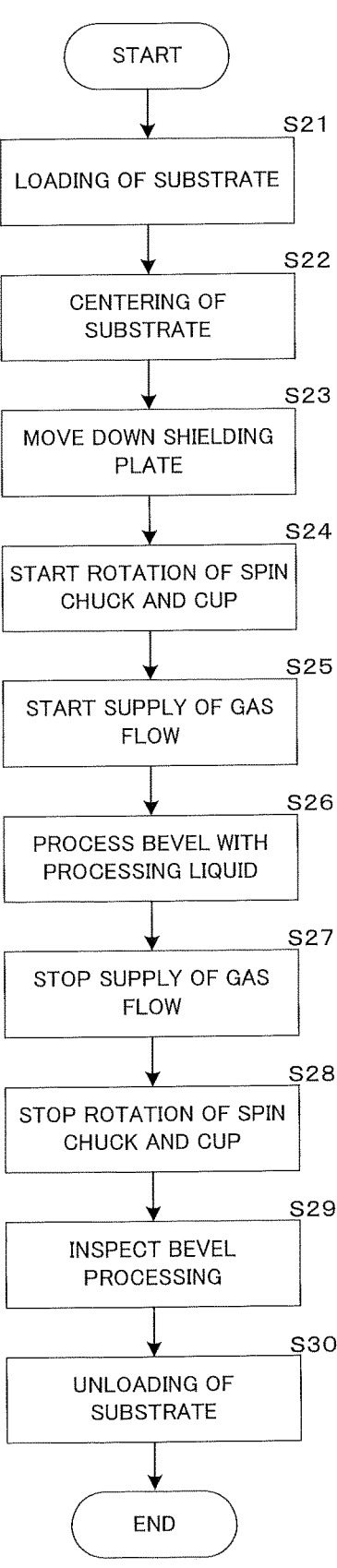
FIG. 27 is a flow chart showing the bevel processing performed as one example of a substrate processing operation by the substrate processing apparatus shown in FIG. 25.
Figure 28A:
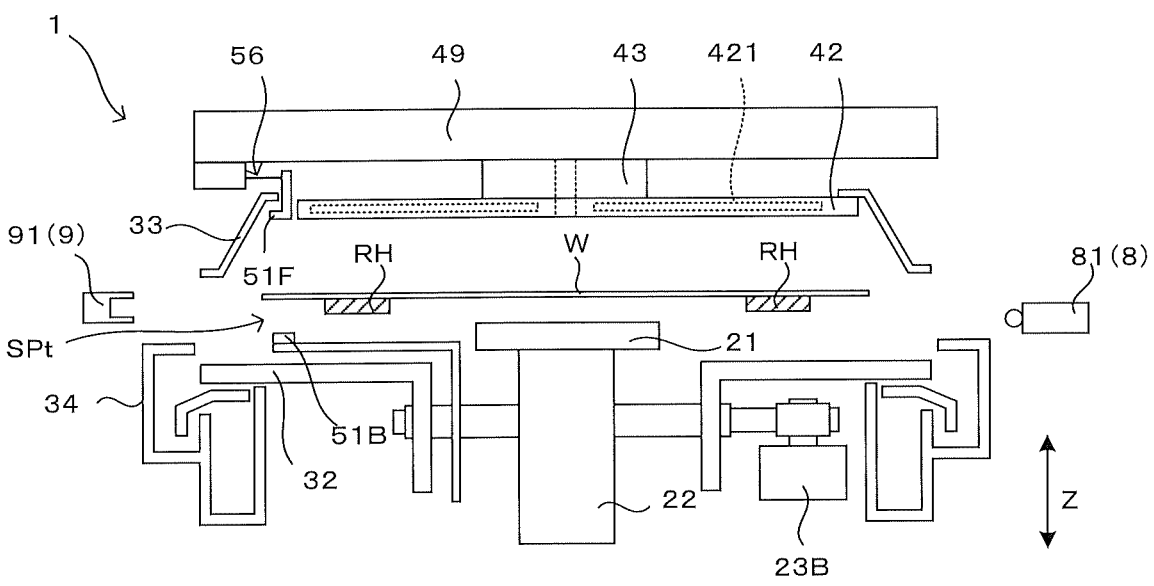
FIGS. 28A to 28D are diagrams showing each component of the apparatus during the bevel processing.

FIG. 27 is a flow chart showing the bevel processing performed as one example of a substrate processing operation by the substrate processing apparatus shown in FIG. 25. Further, FIGS. 28A to 28D are diagrams showing each component of the apparatus during the bevel processing. In the second embodiment, according to the point of difference (A), the bevel processing is performed basically in the same manner as in the first embodiment except that upward and downward movements of a lower sealing cup member 61 are replaced by those of the beam member 49. That is, the arithmetic processor 10A causes the elevation drivers 71, 72 to integrally move up the nozzle head 56, the beam member 49, the support member 43 and the disk part 42. During an upward movement of the beam member 49, a peripheral edge part of the upper surface of the disk part 42 is engaged with the upper annular part 332 of the upper cup 33 and, thereafter, the upper cup 33 is moved up together with the nozzle head 56, the beam member 49, the support member 43 and the disk part 42, and positioned at a retracted position. In this way, a conveyance space SPt sufficient to allow the entrance of a hand RH of a substrate conveyor robot 111 is formed above the spin chuck 21. If it is confirmed that the formation of the conveyance space SPt has been completed, the arithmetic processor 10A gives a loading request of the substrate W to the substrate conveyor robot 111 via a communicator 10F and it is waited until an unprocessed substrate W is carried into the substrate processing apparatus 1 and placed on the spin chuck 21 as shown in FIG. 28A. Then, the substrate W is placed on the spin chuck 21 (Step S21). Note that, at this point of time, a pump 26 is stopped and the substrate W is horizontally movable on the upper surface of the spin chuck 21.

Figure 28B:
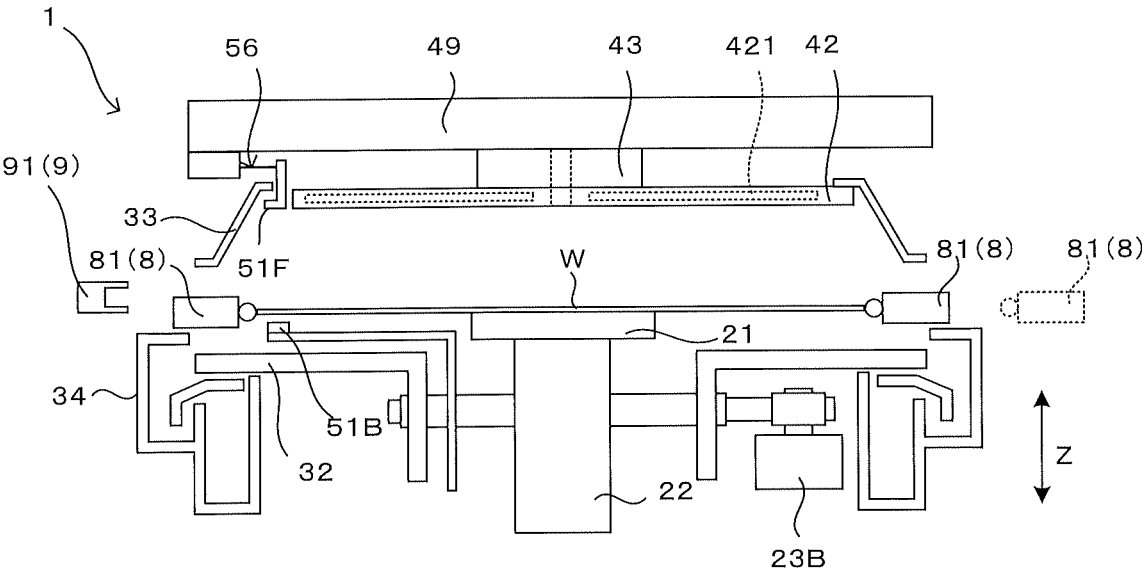

If the loading of the substrate W is completed, the substrate conveyor robot 111 is retracted from the substrate processing apparatus 1. Following that, the arithmetic processor 10A controls a centering driver 82 so that three contact members 81 (only two are shown in FIG. 28B) approach the substrate W. In this way, the eccentricity of the substrate W with respect to the spin chuck 21 is eliminated and a center of the substrate W coincides with that of the spin chuck 21 (Step S22). If a centering processing is completed in this way, the arithmetic processor 10A controls the centering driver 82 to separate the three contact members 81 from the substrate W and applies a negative pressure to the spin chuck 21 by operating the pump 26. In this way, the spin chuck 21 sucks and holds the substrate W from below.

Subsequently, the arithmetic processor 10A gives a move-down command to the elevation drivers 71, 72. In response to this, the elevation drivers 71, 72 integrally moves down the nozzle head 56, the beam member 49, the support member 43 and the disk part 42. During these downward movements, the upper cup 33 supported from below by the peripheral edge part of the upper surface of the disk part 42 is coupled to the lower cup 32. In this way, the rotating cup 31 is formed.

After the rotating cup 31 is formed, the nozzle head 56, the beam member 49, the support member 43 and the disk part 42 are further integrally moved down, and the disk part 42 is positioned at a lower limit position (Step S23). At this lower limit position, the disk part 42 is separated upward from the upper surface Wf of the substrate W by a predetermined distance, e.g. 2 mm. Further, the upper surface nozzles 51F are positioned in the cut 44 of the disk part 42 in such a posture that the discharge ports 511 are facing the peripheral edge part of the upper surface Wf of the substrate W. If preparation for the supply of processing liquids to the substrate W is completed in this way, the arithmetic processor 10A gives a rotation command to the rotation drivers 23A, 23B to start the rotation of the spin chuck 21 holding the substrate W and the rotating cup 31 (Step S24). Rotating speeds of the substrate W and the rotating cup 31 are set, for example, at 1800 rpm. Further, the arithmetic processor 10A controls the drive of a heater driver 422 to heat a heater 421 to a desired temperature, e.g. 185° C.

Subsequently, the arithmetic processor 10A gives a nitrogen gas supply command to a nitrogen gas supplier 47. In this way, as shown by an arrow F1 of FIG. 28C, the supply of the nitrogen gas from the nitrogen gas supplier 47 to a center nozzle 45 is started (Step S25). This nitrogen gas is heated by a ribbon heater 48 while passing in a pipe 46, and is discharged from the center nozzle 45 toward a space sandwiched between the substrate W and the disk part 42 after being heated to a desired temperature (e.g. 100° C.). In this way, the entire upper surface Wf of the substrate W is heated. Further, the substrate W is also heated by the heater 421. Thus, the temperature of the peripheral edge part Ws of the substrate W rises with the passage of time and reaches a temperature suitable for the bevel processing, e.g. 90° C. Further, the temperature of the substrate W other than the peripheral edge part Ws is also increased to a substantially equal temperature. That is, in this embodiment, the in-plane temperature of the upper surface Wf of the substrate W is substantially uniform. Therefore, the warping of the substrate W can be effectively suppressed.

Figure 28C:
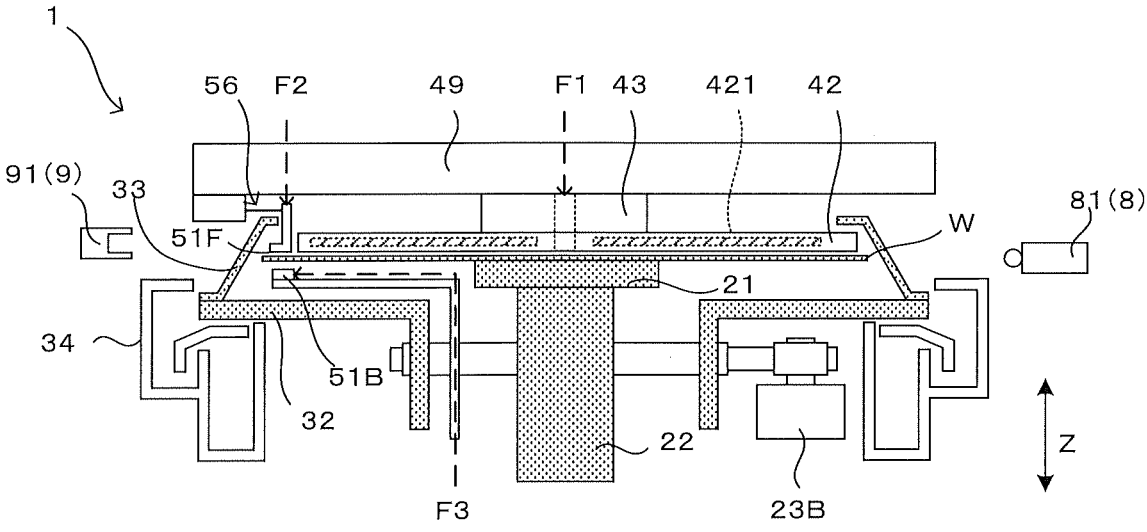
Figure 28D:
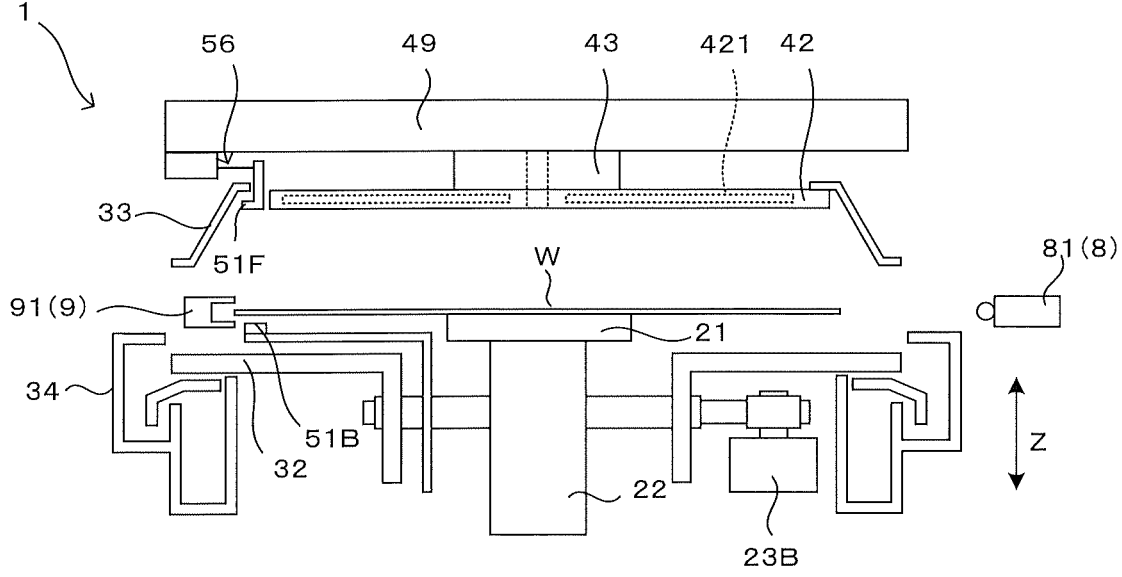

Following this, the arithmetic processor 10A supplies the processing liquids to the upper surface nozzles 51F and lower surface nozzles 51B by controlling processing liquid suppliers 52 (arrows F2, F3 in FIG. 28C). That is, flows of the processing liquids are discharged from the upper surface nozzles 51F to contact the peripheral edge part of the upper surface of the substrate W, and flows of the processing liquids are discharged from the lower surface nozzles 51B to contact the peripheral edge part of the lower surface of the substrate W. In this way, the bevel processing is performed on the peripheral edge part Ws of the substrate W (Step S26).

Upon detecting the passage of a processing time required for the bevel processing of the substrate W, the arithmetic processor 10A gives a supply stop command to the processing liquid suppliers 52 to stop the discharge of the processing liquids.

Following that, the arithmetic processor 10A gives a supply stop command to the nitrogen gas supplier 47 to stop the supply of the nitrogen gas from the nitrogen gas supplier 47 to the center nozzle 45 (Step S27). Further, the arithmetic processor 10A gives a rotation stop command to the rotation drivers 23A, 23B to stop the rotation of the spin chuck 21 and the rotating cup 31 (Step S28).

In next Step S29, the arithmetic processor 10A observes the peripheral edge part Ws of the substrate W to inspect a result of the bevel processing. The arithmetic processor 10A positions the upper cup 33 at the retracted position to form the conveyance space SPt in a manner similar to that during the loading of the substrate W. Then, the arithmetic processor 10A controls an observation head driver 92 to bring an observation head 91 closer to the substrate W. If the peripheral edge part Ws is imaged by the observation head 91, the arithmetic processor 10A controls the observation head driver 92 to retract the observation head 91 from the substrate W. In parallel with this, the arithmetic processor 10A inspects based on the captured image of the peripheral edge part Ws whether or not the bevel processing has been satisfactorily performed (Step S29).

After the inspection, the arithmetic processor 10A gives an unloading request of the substrate W to the substrate conveyor robot 111 via the communicator 10F, and the processed substrate W is carried out from the substrate processing apparatus 1 (Step S30). Note that this series of steps is repeatedly performed.

As described above, according to the second embodiment, the effects A to C are not obtained due to the above point of difference (A), and the effect F is not obtained due to the above point of difference (B). However, the other effects are obtained as in the first embodiment.

In the embodiments described above, the spin chuck 21 corresponds to an example of a "substrate holder" of the invention. The space SPa corresponds to an example of a "space sandwiched between a substrate and a shielding plate" of the invention, and the center nozzle 45 corresponds to an example of a "gas discharge nozzle" of the invention. The air flow velocity at the peripheral edge part Ws corresponds to an example of a "flow velocity of a gas to a discharge space" of the inventio, and that the flow velocity is larger than zero means that the gas is flowing into the discharge space, whereas that the flow velocity is smaller than zero, i.e. negative, means that the gas returns to the space sandwiched between the substrate and the shielding plate. Further, about 57 L/min is shown as a minimum value necessary to make the flow velocity larger than zero in FIG. 22. The pipe 46 and the ribbon heater 48 respectively correspond to examples of a "pipe" and a "first heater" of the invention. The heater 421 corresponds to an example of a "second heater" of the invention. The rotating cup 31 corresponds to an example of a "cup" of the invention. The ratio of the upper surface nozzles 51F with attachment(s) occupying the cut 44 corresponds to an example of an "occupancy ratio" of the invention. The upper surface protecting/heating mechanism 4 corresponds to an example of an "upper surface protecting/heating mechanism" of the invention. The nitrogen gas supplier 47 corresponds to an example of a "gas supplier" of the invention.

Note that the invention is not limited to the embodiments described above and various changes other than the aforementioned ones can be made without departing from the gist of the invention. For example, although the bevel processing is applied to the peripheral edge part Ws of the substrate W using three kinds of the processing liquids in the above embodiments, the kinds of the processing liquids are not limited to these.

Further, in the above embodiments, the invention is applied to the substrate processing apparatuses 1 in which liquid droplets are collected by the rotating cup 31 having a so-called divided structure and obtained by coupling the mutually separable upper and lower cups 33, 32 to each other during the processing to integrate the upper and lower cups 33, 32. However, the application range of the invention is not limited to this and the invention can be also applied to a substrate processing apparatus in which liquid droplets are collected by a rotating cup composed of upper and lower cups integrated in advance.

Although the invention is applied to the substrate processing apparatuses 1 in which the scattering preventing mechanism 3 includes the rotating cup 31 and the fixed cup 34 in the above embodiments, the application range of the invention is not limited to this. For example, the invention can be also applied to a substrate processing apparatus in which liquid droplets from the substrate W are collected by a cup fixedly arranged to surround the outer periphery of the substrate W held on the spin chuck 21.

Although the invention has been described by way of the specific embodiments above, this description is not intended to be interpreted in a limited sense. By referring to the description of the invention, various modifications of the disclosed embodiments will become apparent to a person skilled in this art similarly to other embodiments of the invention. Hence, appended claims are thought to include these modifications and embodiments without departing from the true scope of the invention.

This invention is applicable to substrate processing techniques in general for processing a substrate by supplying a processing liquid to the substrate.

What is claimed is:

1. A substrate processing apparatus, comprising:
    a substrate holder configured to hold a substrate from below and provided rotatably about an axis of rotation extending in a vertical direction;
    a spin chuck configured to rotate the substrate holder;
    a processing liquid discharge nozzle configured to process the substrate by supplying a processing liquid to a peripheral edge part of the substrate held by the substrate holder;
    a shielding plate configured to be arranged at a predetermined interval from the upper surface of the substrate held by the substrate holder and heat an upper surface of the substrate while covering and protecting the upper surface of the substrate;
    a cup configured to collect the processing liquid scattered from the substrate according to rotation of the substrate holder while surrounding an outer periphery of the rotating substrate and thereafter discharge the processing liquid by way of a discharge space; and
    a CPU configured to control the shielding plate, wherein
    the shielding plate includes a gas supplier configured to supply the gas to a gas discharge nozzle provided in the shielding plate so as to form a flow of the gas from a central part toward a radially outer side of the substrate and discharge the gas into a space sandwiched between the substrate and the shielding plate, the CPU controls the gas supplier such that a flow velocity of the gas into the discharge space at the peripheral edge part of the substrate becomes larger than zero,
    an exhauster configured to exhaust the discharge space, and
    the CPU controls the gas supplier such that a discharge flow rate of the gas discharged from the gas discharge nozzle into the space sandwiched between the substrate and the shielding plate becomes equal to or larger than a minimum value necessary to make the flow velocity of the gas into the discharge space at the peripheral edge part of the substrate larger than zero and equal to and smaller than 0.3-fold of an exhaust flow rate exhausted from the discharge space.

2. The substrate processing apparatus according to claim 1, wherein:
    the CPU controls the gas supplier such that a flow rate of the gas supplied to the gas discharge nozzle becomes equal to or smaller than the exhaust flow rate exhausted from the discharge space.

3. A substrate processing apparatus, comprising:
    a substrate holder configured to hold a substrate from below and provided rotatably about an axis of rotation extending in a vertical direction;
    a spin chuck configured to rotate the substrate holder;
    a processing liquid discharge nozzle configured to discharge a processing liquid from a discharge port, configured to process the substrate by causing the processing liquid discharged from the discharge port to land on a peripheral edge part of the substrate held by the substrate holder;
    a shielding plate configured to heat an upper surface of the substrate while covering and protecting the upper surface of the substrate by a shielding plate arranged at a predetermined interval from the upper surface of the substrate held by the substrate holder;
    a CPU configured to control an upper surface protecting/heating mechanism;
    a cup configured to collect the processing liquid scattered from the substrate in association with rotation of the substrate holder while surrounding an outer periphery of the substrate being rotated, wherein
    a cut opening radially outwardly of the shielding plate and being provided in a peripheral edge part of the shielding plate,
    a nozzle mover configured to move the processing liquid discharge nozzle in the cut, and
    the CPU controlling the nozzle mover such that the discharge port faces a liquid landing position after a change in changing the liquid landing position of the processing liquid discharged from the discharge port, wherein the CPU controls the nozzle mover such that, with the processing liquid discharge nozzle being positioned within the cut, the liquid landing position is switched between a bevel processing position where the liquid landing position is at a peripheral edge part of the upper surface of the substrate and a pre-dispense processing position where the liquid landing position is at the cup.

4. The substrate processing apparatus according to claim 3, wherein:
    the processing liquid discharge nozzle is provided movably in a radial direction of the shielding plate in the cut, and the CPU controls the nozzle mover such that the liquid landing position is changed by the processing liquid discharge nozzle moving in the radial direction of the shielding plate.

5. The substrate processing apparatus according to claim 3, wherein:

the processing liquid discharge nozzle is provided pivotally about a pivot axis parallel to the vertical direction in the cut, and the CPU controls the nozzle mover such that the liquid landing position is changed by the processing liquid discharge nozzle moving about the pivot axis.

6. The substrate processing apparatus according to claim 5, wherein:

the CPU controls the nozzle mover such that the liquid landing position is switched between a bevel processing position where the liquid landing position is at a peripheral edge part of the upper surface of the substrate and a pre-dispense processing where the liquid landing position is at the cup.

* * * * *